(12) United States Patent
Lee et al.

(10) Patent No.: US 9,911,907 B2
(45) Date of Patent: Mar. 6, 2018

(54) LIGHT-EMITTING APPARATUS

(71) Applicant: EPISTAR CORPORATION, Hsinchu (TW)

(72) Inventors: Tsung-Xian Lee, Taoyuan County (TW); Jian-Fong Jhou, Taipei (TW); Yun-Jie Huang, New Taipei (TW); Bo-Song Chen, Taipei (TW)

(73) Assignee: EPISTAR CORPORATION, Hsinchu (TW)

( * ) Notice: Subject to any disclaimer, the term of this patent is extended or adjusted under 35 U.S.C. 154(b) by 23 days.

(21) Appl. No.: 14/810,180

(22) Filed: Jul. 27, 2015

(65) Prior Publication Data

US 2016/0056348 A1 Feb. 25, 2016

Related U.S. Application Data

(60) Provisional application No. 62/029,977, filed on Jul. 28, 2014.

(51) Int. Cl.
*H01L 29/18* (2006.01)
*H01L 33/50* (2010.01)
*G02F 1/1335* (2006.01)

(52) U.S. Cl.
CPC .......... *H01L 33/507* (2013.01); *H01L 33/505* (2013.01); *G02F 2001/133607* (2013.01); *G02F 2001/133614* (2013.01)

(58) Field of Classification Search
CPC ................. H01L 33/507; H01L 33/505; G02F 1/133606; G02F 2001/133607

USPC ........................................... 257/88
See application file for complete search history.

(56) References Cited

U.S. PATENT DOCUMENTS

| | | | | |
|---|---|---|---|---|
| 7,942,556 B2* | 5/2011 | Harbers | ................... | F21K 9/54 362/230 |
| 8,434,887 B2* | 5/2013 | Seetzen | ............. | G02F 1/133605 362/231 |
| 2006/0114369 A1* | 6/2006 | Lee | ..................... | G02F 1/13362 349/61 |
| 2008/0029775 A1* | 2/2008 | Liu | ........................ | H01L 33/52 257/98 |
| 2008/0100774 A1* | 5/2008 | Jeon | ................. | G02F 1/133606 349/62 |
| 2008/0230795 A1* | 9/2008 | Dias | ....................... | H01L 33/504 257/98 |
| 2010/0061087 A1* | 3/2010 | Stevens | ............. | G02F 1/133605 362/97.3 |
| 2011/0193118 A1* | 8/2011 | Oshima | ................... | H01L 33/56 257/98 |
| 2013/0027946 A1* | 1/2013 | Tseng | ...................... | H01L 33/58 362/294 |
| 2013/0099661 A1* | 4/2013 | Gasse | .................... | H05B 33/10 313/512 |

(Continued)

*Primary Examiner* — Hoan C Nguyen
(74) *Attorney, Agent, or Firm* — Muncy, Geissler, Olds & Lowe, P.C.

(57) ABSTRACT

The present application discloses a light-emitting apparatus having a light-emitting device and a wavelength conversion layer. The light-emitting device has a first top surface and a first side surface, and the wavelength conversion layer has a second top surface and a second side surface and covers the first top surface. A ratio of a distance between the first top surface to the second top surface and a distance between the first side surface and the second side surface is between 1.1~1.3.

9 Claims, 30 Drawing Sheets

(56) References Cited

U.S. PATENT DOCUMENTS

2014/0131749 A1* 5/2014 Yao ..................... H01L 25/0753
257/89

* cited by examiner

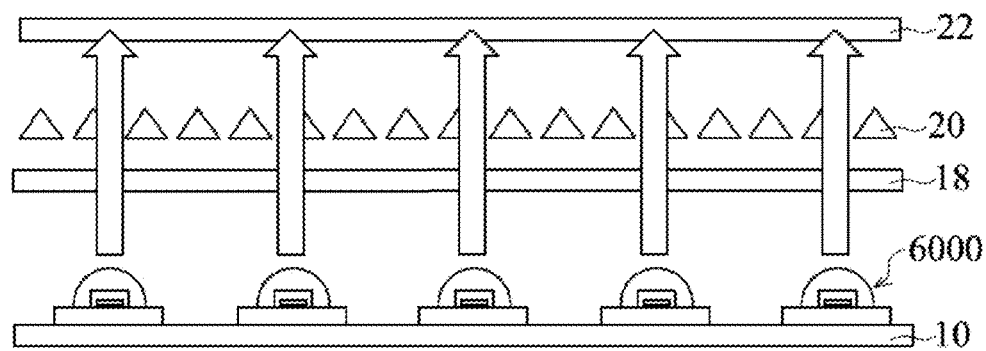
FIG. 11A
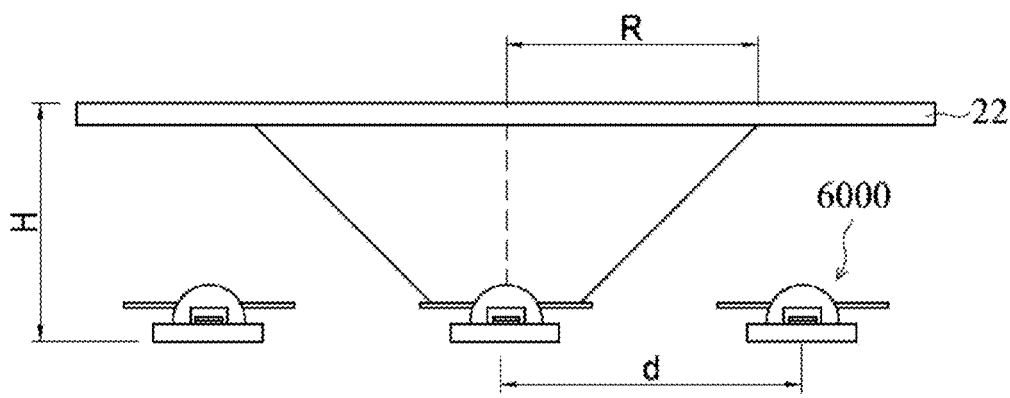
FIG. 11B
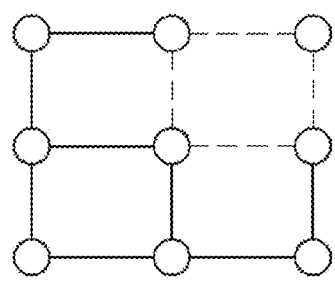   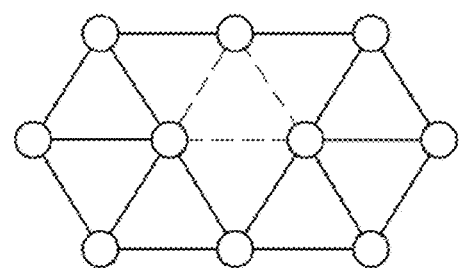
FIG. 11C                FIG. 11D

US 9,911,907 B2

LIGHT-EMITTING APPARATUS

CROSS-REFERENCE TO RELATED APPLICATION

This application claims the benefit of U.S. Provisional Application, Ser. No. 62/029,977, filed on Jul. 28, 2014. The Provisional Application and its English translation are incorporated herein by reference in their entirety.

BACKGROUND

Technical Field

The present disclosure relates to a light-emitting apparatus and in particular to a light-emitting apparatus having a semiconductor light-emitting element and an optical element.

Description of the Related Art

A light-emitting device having light-emitting diode (LED) is gradually taking the place of traditional incandescent light for energy saving, environmental protection, long operation life, compact, and so on.

Various kinds of optical elements, such as lens, reflector, and wavelength converter, can be used to change the optical properties of the light-emitting device. The lens can be used to collect or redistribute light from LEDs. The reflector can redirect light from LEDs to a desired direction. Moreover, the wavelength converter, such as phosphor, dye, or quantum dot, can convert color light from LEDs to another one.

SUMMARY OF THE DISCLOSURE

The present application discloses a light-emitting apparatus having a light-emitting device and a wavelength conversion layer. The light-emitting device has a first top surface and a first side surface, and the wavelength conversion layer has a second top surface and a second side surface and covers the first top surface. A ratio of a distance between the first top surface to the second top surface and a distance between the first side surface and the second side surface is between 1.1~1.3.

A light-emitting apparatus has a light-emitting device, a wavelength conversion layer covering the light-emitting device, a first lens on the light-emitting device, a second lens on the first lens, and a wavelength conversion layer connected to the second lens. The first lens ha a top surface bent in a first direction, and the second lens has an inner surface bent in a second direction which is different from the first direction.

A light-emitting apparatus has a first light-emitting device, a second light-emitting devices spaced from first light-emitting device by a first distance, a diffusion layer covering the first and second light-emitting devices, a prism layer on the diffusion layer, and an LCD module on the prism layer. The first light-emitting device or the second light-emitting device is configured to provide a light field on the LCD module and having a radius two or more times larger than the first distance.

BRIEF DESCRIPTION OF THE DRAWINGS

FIGS. 11A-11H show a light-emitting apparatus and related optical properties in accordance with an embodiment of the present disclosure.

DETAILED DESCRIPTION OF THE EMBODIMENTS

Figure 1A:
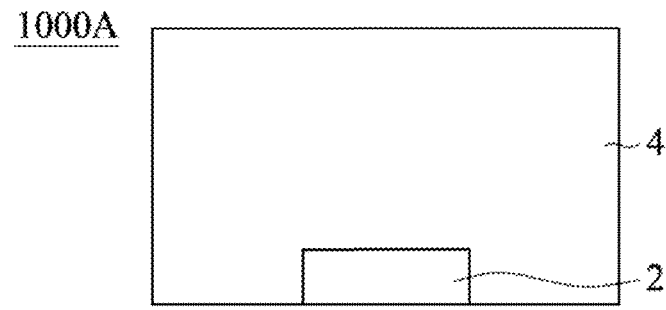
FIGS. 1A-1H show light-emitting devices in accordance with embodiments of the present disclosure.

The drawings illustrate the embodiments of the disclosure and, together with the description, serve to illustrate the principles of the application. The same name or the same reference numeral given or appeared in different paragraphs or figures along the specification can has the same or equivalent meaning(s) while it is once defined anywhere of the disclosure. The thickness or the shape of an element in the specification can be expanded or narrowed.

FIG. 1A shows a light-emitting device 1000A in accordance with an embodiment of the present disclosure. The light-emitting device 1000A includes a light-emitting diode 2 and a wavelength conversion layer 4 which is directly formed on the light-emitting diode 2 and surrounds the light-emitting diode 2. The light-emitting device 1000B has a transparent layer 6 formed between the wavelength conversion layer 4 and the light-emitting diode 2. The transparent layer 6 covers the top surface, side surface of the light-emitting diode 2 and laterally extends to edges of the light-emitting device 1000B. Therefore, the light-emitting diode 2 is separated from the wavelength conversion layer 4 by the transparent layer 6.

The light-emitting device 1000C has a transparent cover 8 formed on the wavelength conversion layer 4. The light-emitting device 1000D has a transparent cover 8, a wavelength conversion layer 4, a transparent layer 6 and a light-emitting diode 2 stacked in sequence from top to bottom. The wavelength conversion layer 4 of the light-emitting device 1000D has a bottom surface with a contour identical or similar to that of a top surface of the transparent layer 6, and a top surface with a contour identical or similar to that of a bottom surface of the transparent cover 8. Moreover, the top and bottom surfaces of the wavelength conversion layer 4 of the light-emitting device 1000D can have identical or different contours. The wavelength conversion layer 4 of the light-emitting device 1000D has two surfaces (top and bottom surfaces) parallel to each other. The wavelength conversion layer 4 of the light-emitting device 1000E is formed on the transparent layer 6 and has a bottom surface close to the transparent layer 6 and with a contour identical or similar to the top surface of the transparent layer 6, and a top surface formed in a flat contour or parallel to a top surface of the light-emitting device 1000E or the transparent cover 8. The wavelength conversion layer 4 of the light-emitting device 1000E has a bottom surface stretching along the contour of the light-emitting diode 2 and a flat top surface.

The light-emitting device 1000F has a transparent layer 6 which covers the top surface and side surfaces of the light-emitting diode 2. In one embodiment, the outer surfaces of the transparent layer 6 are respectively parallel to the inner surfaces of the transparent layer 6. In other words, the transparent layer 6 has a uniform thickness.

The light-emitting device 1000G has a transparent layer 6 which covers the top surface and side surfaces of the light-emitting diode 2. A wavelength conversion layer 4 covers the top surface and side surfaces of transparent layer 6. A transparent cover 8 having a rectangular cross-section is formed on the top surface of the wavelength conversion layer 4. The wavelength conversion layer 4 has a top thickness at the top of the light-emitting diode 2 and a lateral thickness at the lateral of the light-emitting diode 2. The lateral thickness is greater than the top thickness.

The light-emitting diode 2 has an active layer to emit an incoherent light. The light emitted from the light-emitting diode 2 has a first light intensity, a first light field, and a first color. The wavelength conversion layer 4 has a wavelength conversion material having a particle size ranged between 8~50 μm, such as 8, 17, 20, 32 or 46 μm. The particle size can be a diameter or a characteristic length. The transparent layer 6 and the transparent cover 8 have transparent material. At least 60% of the light emitted from the light-emitting diode 2 can pass through the transparent layer 6 or the transparent cover 8 without being absorbed, i.e. the transparent layer 6 or the transparent cover 8 has a 60% transparency to the light from the light-emitting diode 2. The light-emitting devices 1000A~1000H can emit a light having a second light intensity, a second light field, and a second color. The second light intensity is smaller than the first light intensity, due to part of the light form the light-emitting diode 2 is absorbed by or trapped in the wavelength conversion layer 4, the transparent layer 6 or the transparent cover 8. The second light field can be identical with or different from the first light field. Diffusion particles can be added to the transparent layer 6 or the transparent cover 8 to scatter light and change light field. The light path in the aforementioned embodiments can be visualized by adopting an appropriate simulation model, such as Monte Carlo ray tracing method. The light propagation within the wavelength conversion layer 4 can be visualized by using a simulation model based on Mie Scattering theory.

Figure 1B:
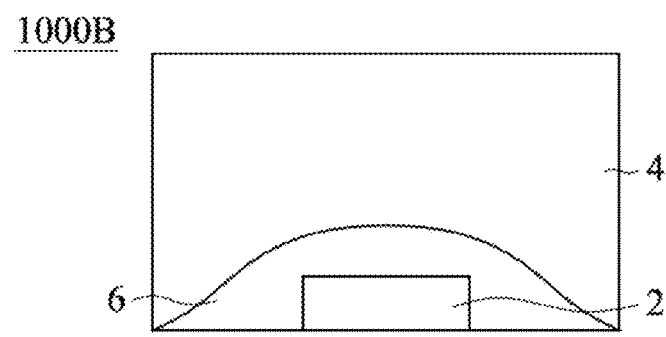
Figure 1C:
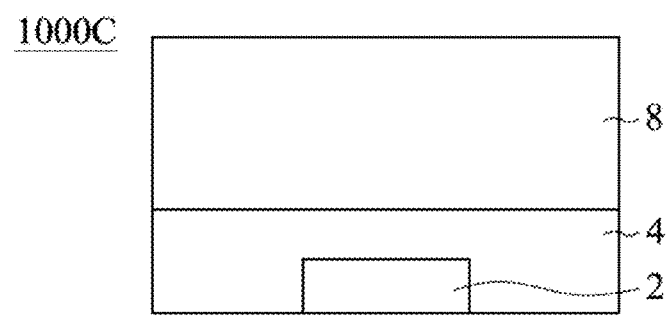
Figure 1D:
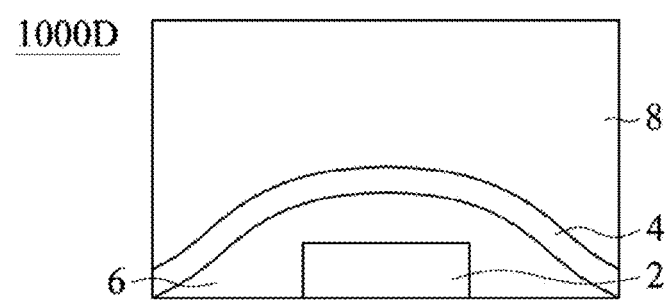
Figure 1E:
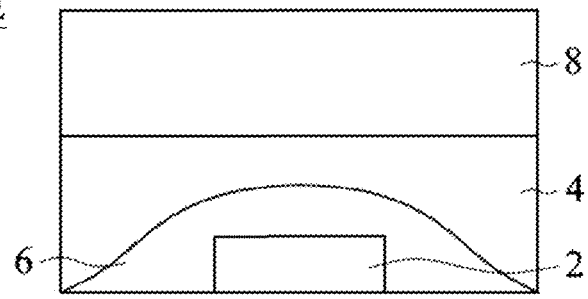
Figure 1F:
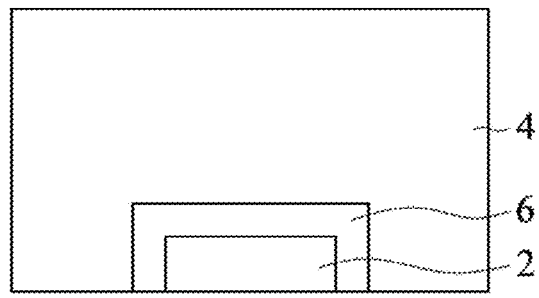
Figure 1G:
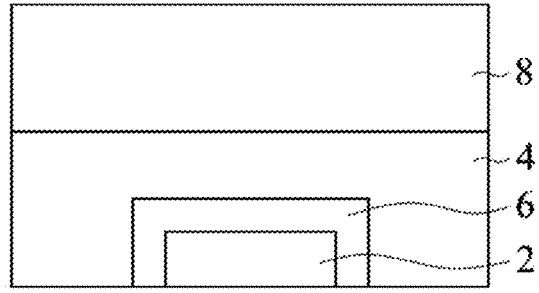
Figure 1H:
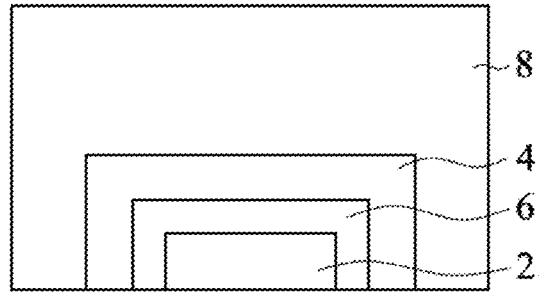

Referring to FIGS. 1B and 1D, the transparent layer 6 has a curved contour. The curved contour is convexly bent on the top surface of the light-emitting diode 2. The wavelength conversion layer 4 is formed on the curved top surface of the transparent layer 6 and therefore has a concavely-bent bottom surface. The transparent layer 6 further has a lower surface which has a contour similar to the shape of the light-emitting diode 2. Referring to FIGS. 1F, 1G and 1H, the transparent layer 6 and the wavelength conversion layer 4 substantially have reversed-U shapes. Referring to FIG. 1H, the transparent cover 8 also has a reversed-U shape, while the reversed-U shape has a top portion and a lateral portion with is thinner than the top portion.

Figure 2A:
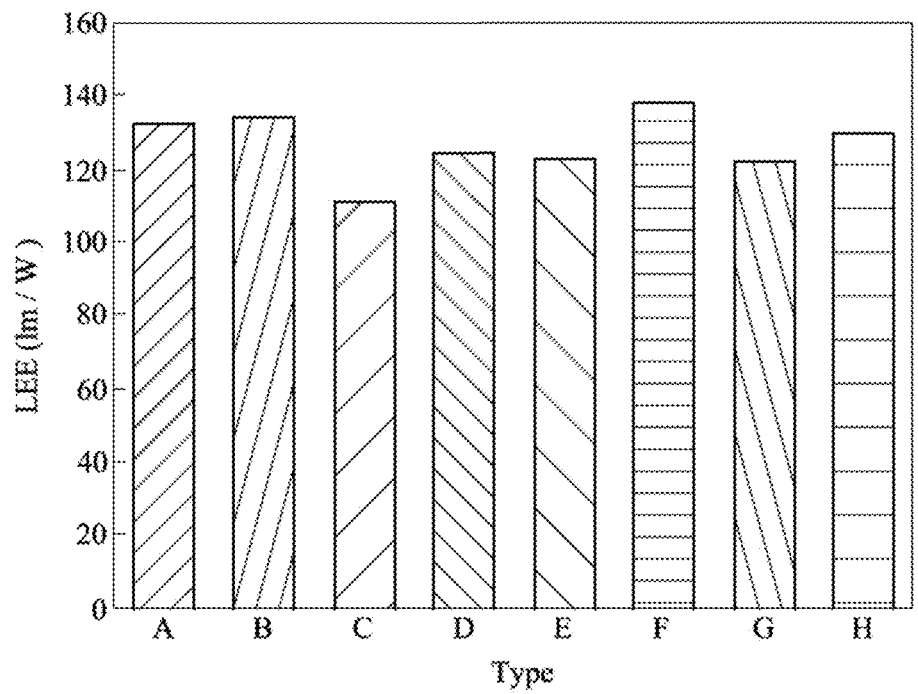
FIGS. 2A-2D show properties of light-emitting devices in accordance with embodiments of the present disclosure.
Figure 2B:
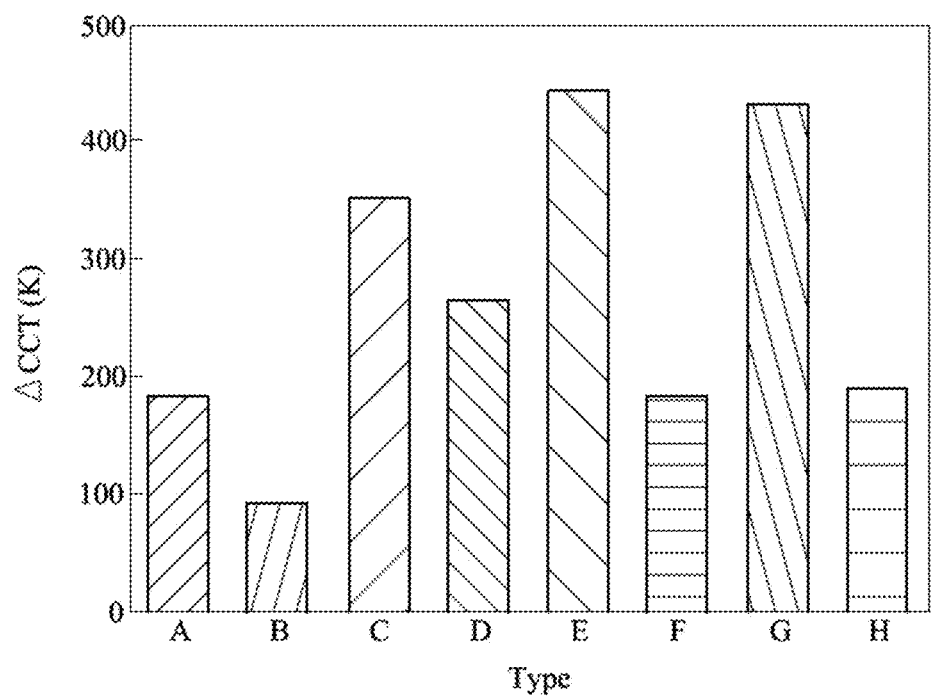
Figure 2C:
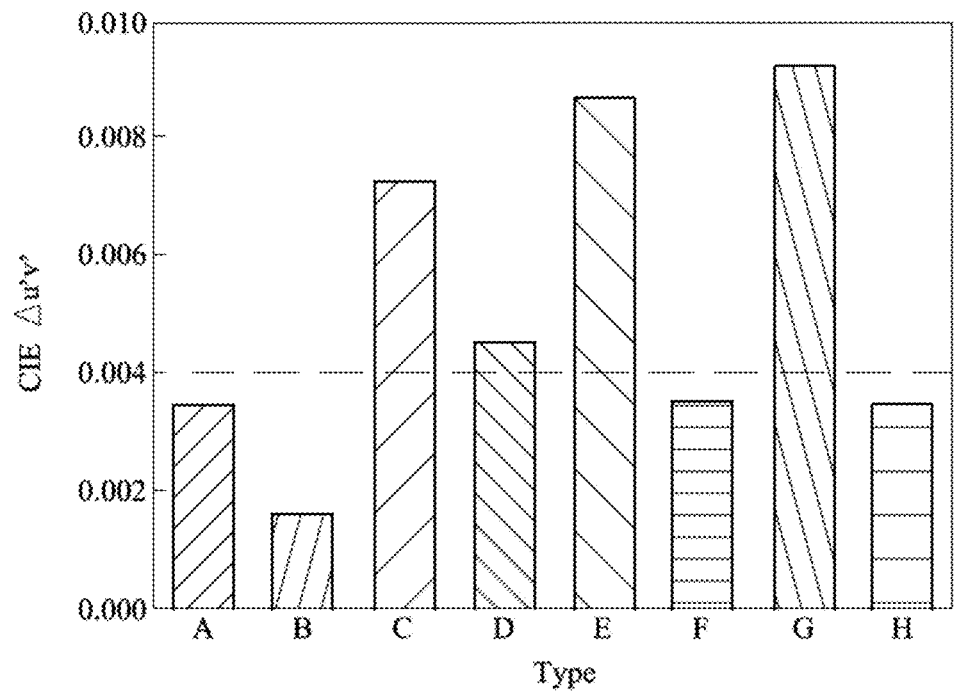
Figure 2D:
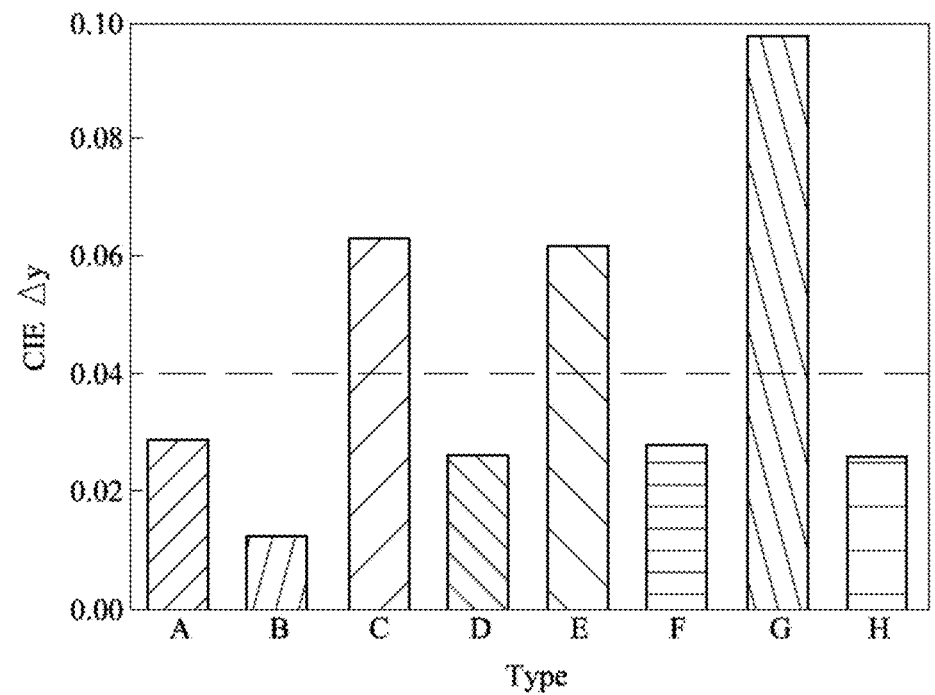

FIGS. 2A-2D show characteristics of light-emitting devices in accordance with an embodiment of the present disclosure. FIG. 2A shows the light extraction efficiency of the light-emitting devices 1000A~1000H. The light extraction efficiencies are ranged between 100~140 lm/w. The light-emitting device 1000F has the best light extraction efficiency. FIG. 2B shows the color temperature variance over angle within a range between −90°~+90° of the light field of the light-emitting devices 1000A~1000H. The variance are ranged between 100~450 K. FIGS. 2C~2D show the difference of color over angle in two different units, wherein the differences of Δu'v' are between 0.001~0.009 and the differences of Δy are between 0.0~10.1.

Figure 3A:
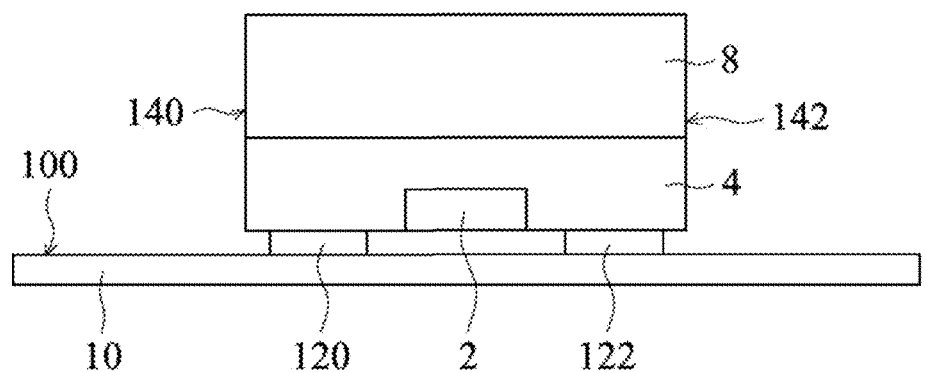
FIG. 3A shows a light-emitting apparatus in accordance with an embodiment of the present disclosure.
Figure 3B:
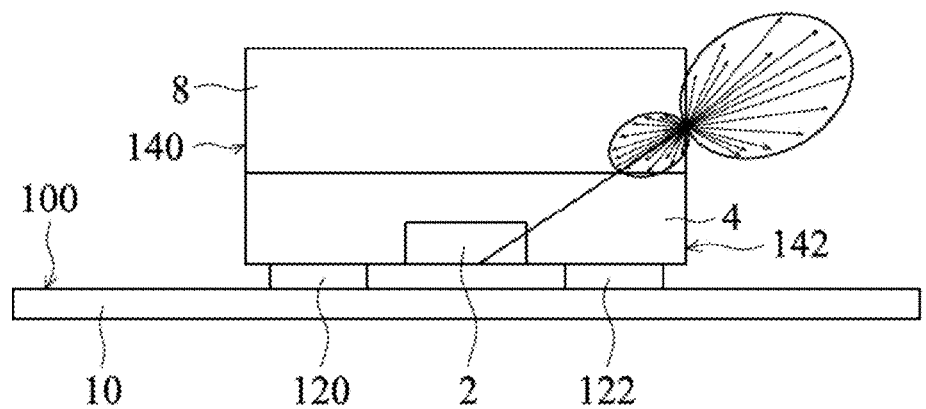
FIGS. 3B-3C show structures in accordance with an embodiment of the present disclosure.
Figure 3C:
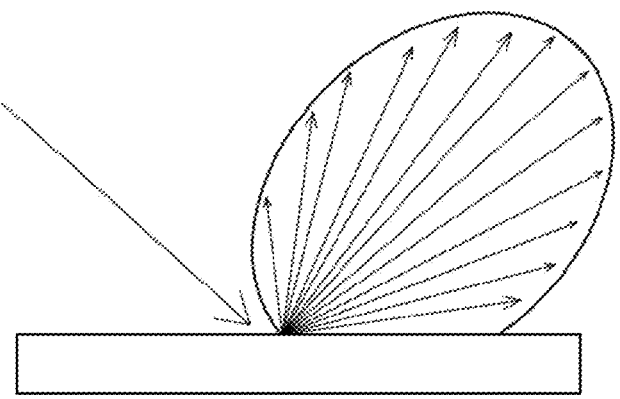
Figure 3D:
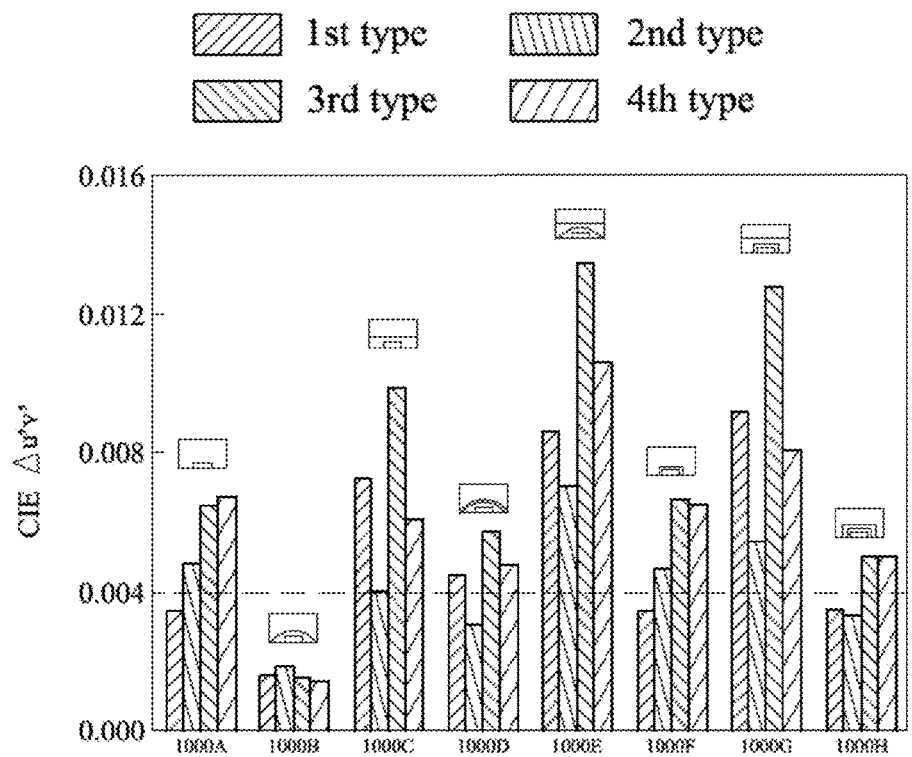
FIGS. 3D-3E show light properties of light-emitting apparatuses in accordance with embodiments of the present disclosure.

FIG. 3A show a structure having a light-emitting apparatus 1003A in accordance with an embodiment of the present disclosure. The light-emitting apparatus 1003A has a light-emitting device 1000C formed on a top surface 100 of the carrier 10 through conductive portions 120 and 122. The side walls 140 and 142 of the light-emitting apparatus 1003A can be Lambertian scattering surfaces which can scatter light, as shown in FIG. 3B. The top surface 100 can be a surface with a reflectivity of 90% and an absorptivity of 10%, or a Lambertian surface which can scatter light, as shown in FIG. 3C. FIG. 3D shows the color variance over angle within a range between −90°~+90° of 8 light-emitting apparatuses (light-emitting devices 1000A~1000H) with different types of top surfaces 100 and side walls 140 and 142. Referring to FIG. 3D, the structure having a Lambertian scattering side wall has a worse color space uniformity compared with the structure having a flat side wall.

Figure 3E:
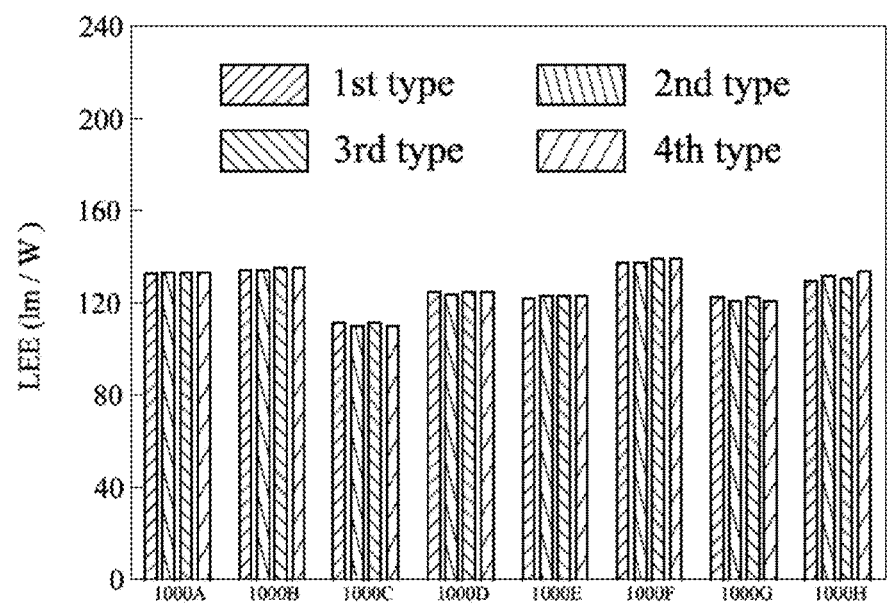

FIG. 3E shows the light extraction efficiency (LEE) of 8 light-emitting apparatuses with different types of top surfaces 100 and side walls 140 and 142. Each of the light-emitting apparatus is measured under four different conditions. The top surface 100 is a Lambertian scattering surface and the side walls 140 and 142 are flat in the first type condition. The top surface 100 and the side walls 140 and 142 are Lambertian scattering surfaces in the second type condition. The top surface 100 is a reflective surface and has a 90% reflectivity related to the light from the light-emitting diode, and the side walls 140 and 142 are flat in the third type condition. The top surface 100 is a reflective surface, and the side walls 140 and 142 are Lambertian scattering surfaces in the fourth type condition. According to FIGS. 3D~3E, the light-emitting apparatuses which comprises light-emitting device 1000F and 1000 B have light-emitting efficiencies larger than 130 lm/W and color temperature variance less than 0.004 under some conditions.

Figure 4A:
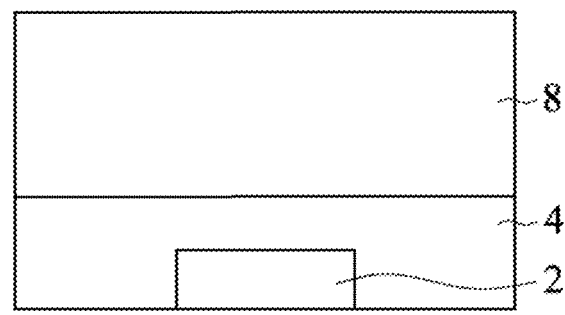
FIGS. 4A-4C show structures in accordance with an embodiment of the present disclosure.
Figure 4B:
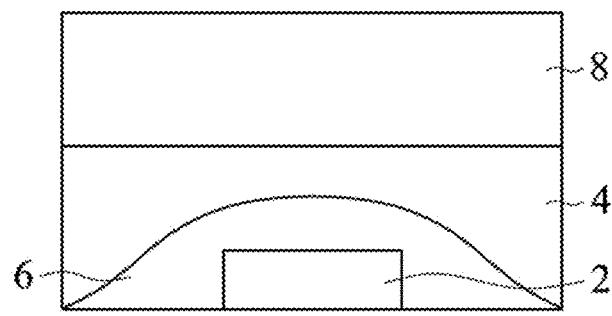

FIGS. 4A and 4B show structures in accordance with an embodiment of the present disclosure. When the thickness of the wavelength conversion layer 4 in FIGS. 4A and 4B are increased, the light extraction efficiencies of the structures are increased, the uniformities of color within a space of the light-emitting structures are improved, and the color temperature uniformity of the light-emitting structures are improved. Moreover, the thickness increase of the wavelength conversion layer 4 has more notable effect upon the structure in FIG. 4B. To be more specific, the light extraction efficiency of structure in FIG. 4B increases 4.89%, the ΔCCT decreases from 486K to 128K, and the Δu'v' decreases from 0.0088 to 0.002 with an increase of thickness from 100 μm to 300 μm; while the light extraction efficiency of structure in FIG. 4A increases 10.97%, the ΔCCT decreases from 529K to 289K, and the Δu'v' decreases from 0.0089 to 0.0055 with an increase of thickness from 100 μm to 400 μm. However, the optical properties of structure in FIG. 4B are improved substantially equal to those in FIG. 4A with less increase of thickness of the wavelength conversion layer 4.

Figure 4C:
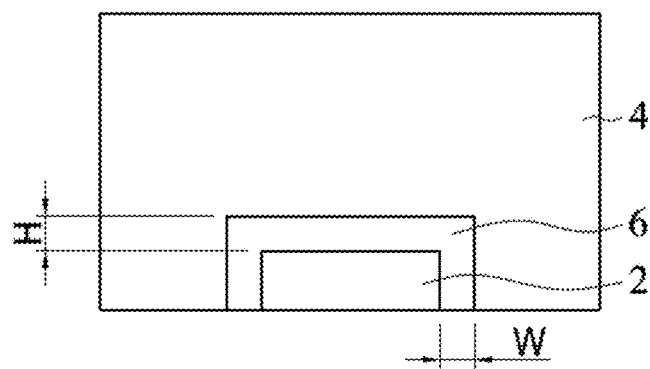
Figure 4D:
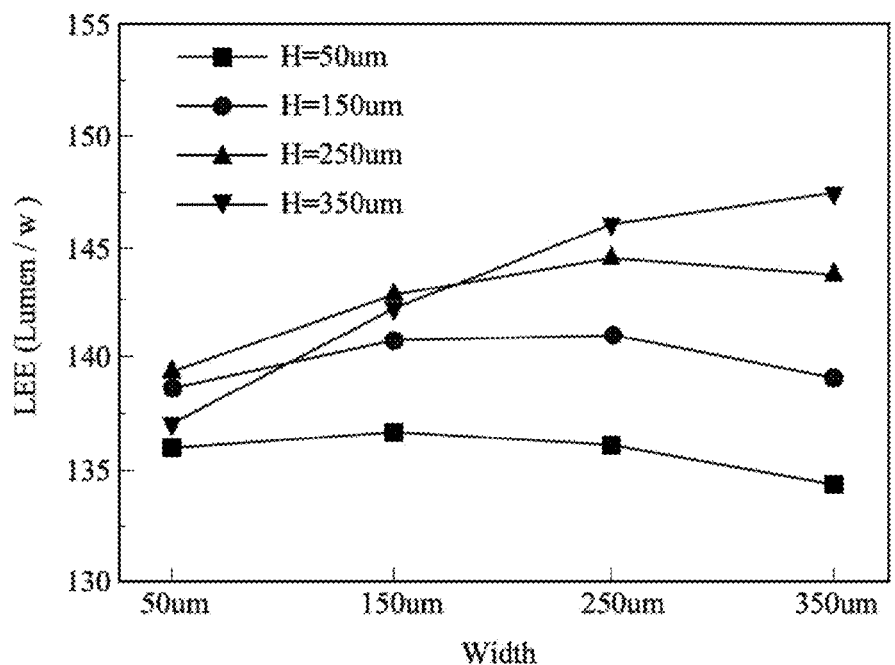
FIGS. 4D-4F show light properties of light-emitting apparatuses in accordance with embodiments of the present disclosure.
Figure 4E:
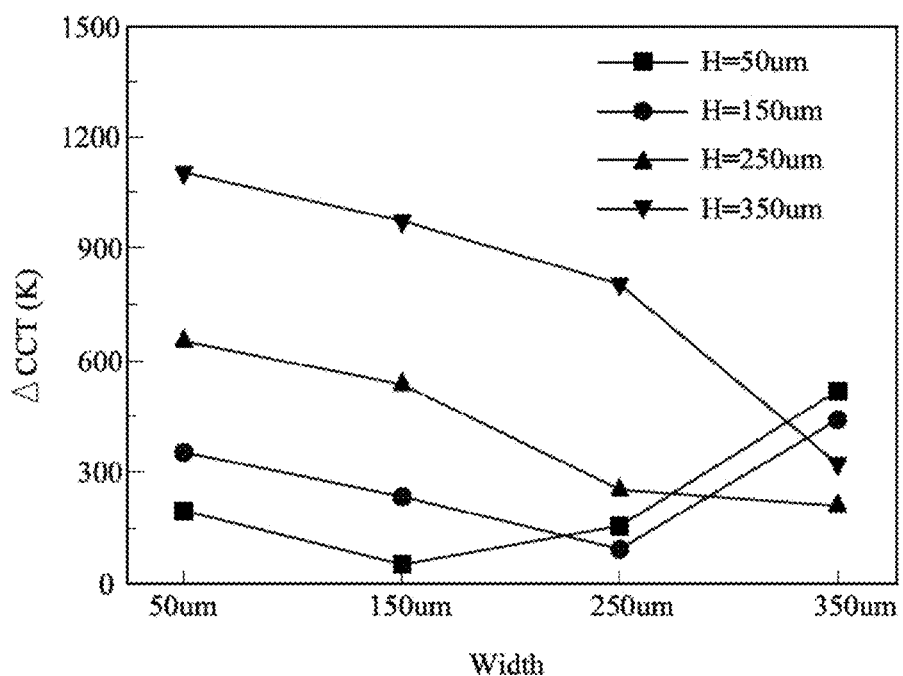
Figure 4F:
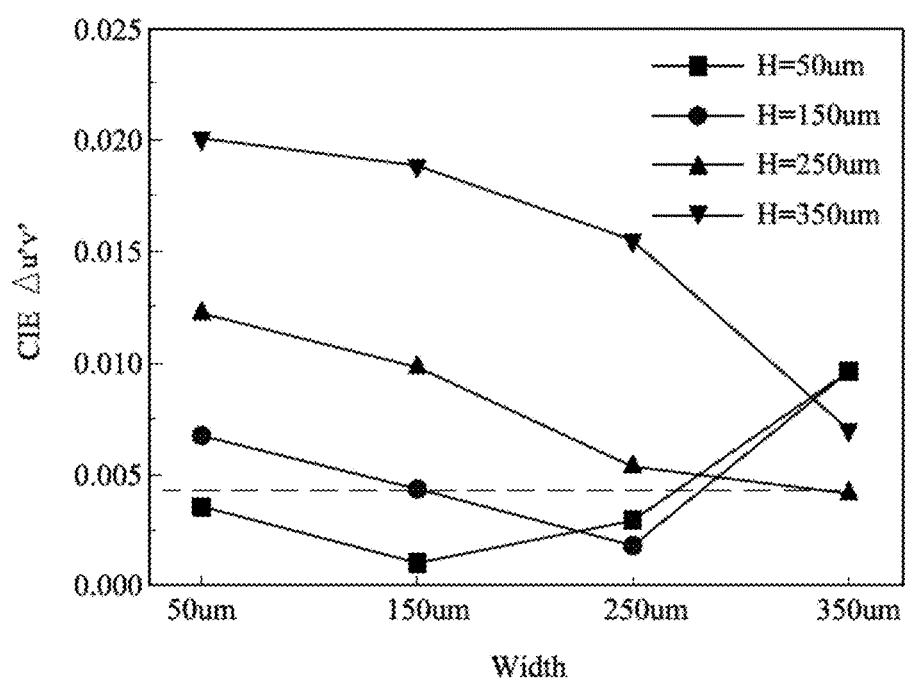

FIGS. 4C-4F show structures and their optical properties. In FIGS. 4D~4F, ordinates represent optical properties, such as light extraction efficiency, ΔCCT and color space uniformity Δu'v'. Abscissas represent the width W between the light-emitting diode 2 and the wavelength conversion layer 4, as shown in FIG. 4C. With the increase of height(H) from 50 μm to 350 μm and the increase of width(W) from 50 μm to 350 μm, the light extraction efficiency improves by about 7.53% from 135 lm/W, as shown in FIG. 4D. The color space uniformity Δu'v' improves by about 34.8% from 0.02 to less than 0.01, as shown in FIG. 4F. The color temperature variance ΔCCT decreases from 1100K around to less than 500K, as shown in FIG. 4E. The light extraction efficiency is remarkably improved when the height H is larger than 250 μm. The color space uniformity Δu'v' is about 0.01 when the height H is 50 μm and width W is 150 μm.

Figure 5A:
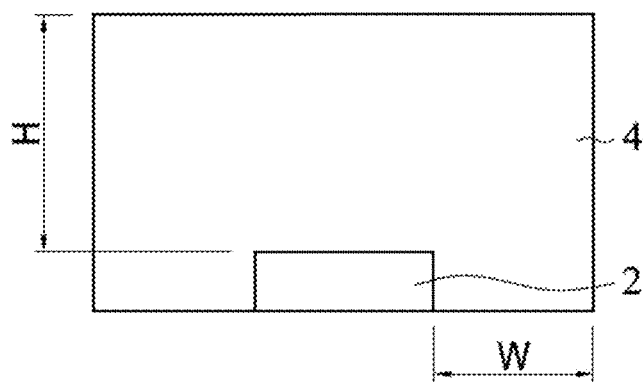
FIGS. 5A-5C show light-emitting devices in accordance with embodiments of the present disclosure.
Figure 5B:
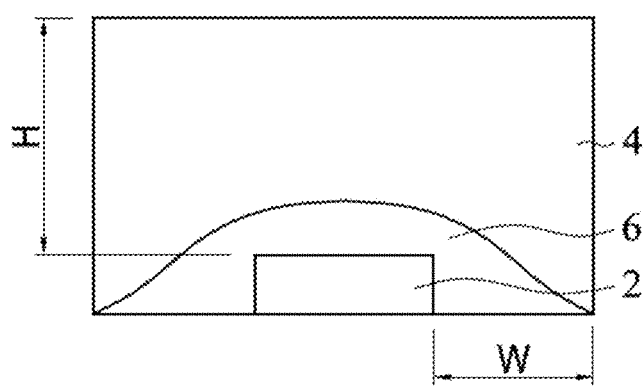
Figure 5C:
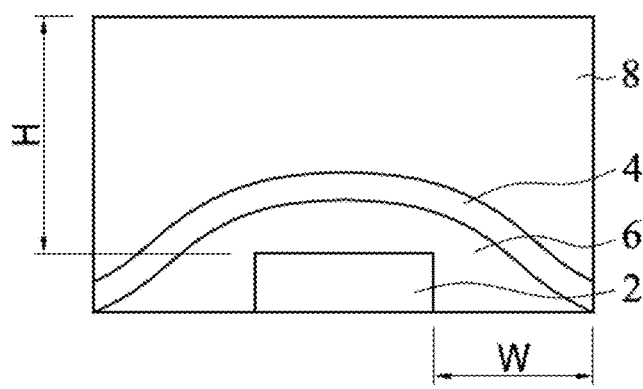
Figure 6A:
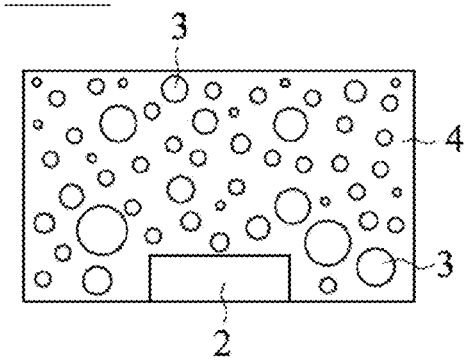
FIGS. 6A-6F show light-emitting devices in accordance with embodiments of the present disclosure.
Figure 6B:
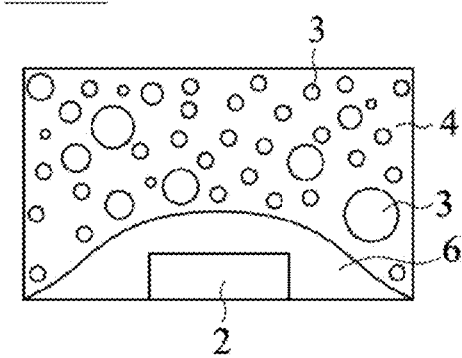
Figure 6C:
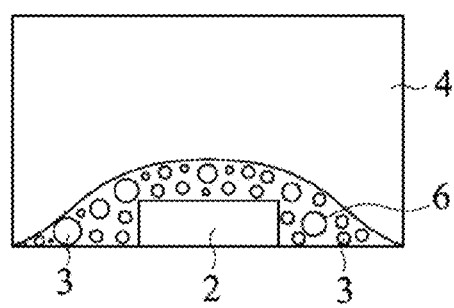
Figure 6D:
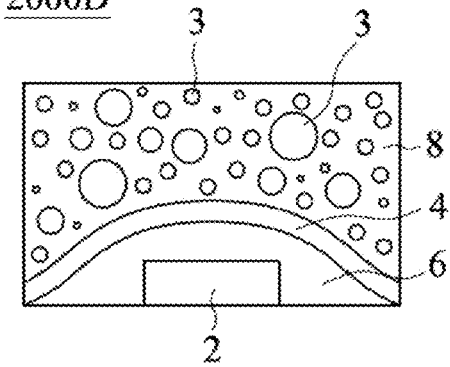
Figure 6E:
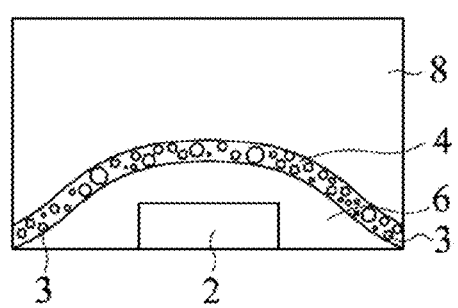
Figure 6F:
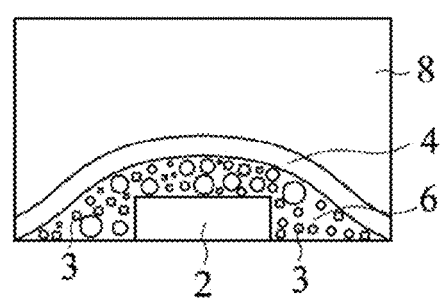

FIGS. 5A-5C show structures in accordance with an embodiment of the present disclosure. Referring to structure of light-emitting device in FIG. 5A, with the height H of about 750 μm and the size of the light-emitting device in a square of 2×2 mm$^2$, the light extraction efficiency is larger than 135 lm/W, the color space uniformity Δu'v' is about of 0.004, and the color temperature variance ΔCCT is about 200K. The light-emitting device in FIG. 5A has better optical properties, such as light extraction efficiency, color space uniformity Δu'v' and color temperature variance ΔCCT, when the height H is 350 μm and size is of 1×1 mm$^2$, or when the height H is 450 μm and size is of 1.2×1.2 mm$^2$.

Referring to FIG. 5B, the color space uniformity Δu'v' is about of 0.002, and the color temperature variance ΔCCT is about 100K, when the distance H is about 750 μm and the size of the light-emitting device is in a square of 1.8×1.8 mm$^2$. The light extraction efficiency is larger than 135 lm/Watt when the distance H is about 750 μm and the size of the light-emitting device is a square of 2×2 mm$^2$. The light-emitting device in FIG. 5B has better optical properties, such as light extraction efficiency, color space uniformity Δu'v' and color temperature variance ΔCCT, when the distance H is 350 μm and size is of 1.2×1.2 mm$^2$ or when the distance H is 450 μm and size is of 1.2×1.2 mm$^2$.

Compared with structure of light-emitting device in FIG. 5B, the light-emitting device in FIG. 5C has better optical properties, such as light extraction efficiency, color space uniformity Δu'v' and color temperature variance ΔCCT, when the distance H is 350 μm and size of 1.2×1.2 mm$^2$, when the distance H is 450 μm and size of 1.2×1.2 mm$^2$, or when the distance H is 750 μm and size of 1.4×1.4 mm$^2$. The light provided by light-emitting devices in FIGS. 5A~5C has better performance at a specific sizes of distance H and distance W. For example, the color space uniformity Δu'v' is better with a ratio, HWR (HWR=H/W), between 1.1~1.3, and the light has a color space uniformity Δu'v' within four MacAdam ellipse when the HWR is larger than 0.7.

Provided the light-emitting devices shown in either of FIGS. 5A~5C can be arranged on the carrier 10 shown in FIG. 3A, and the light provided by the light-emitting devices in FIG. 5A~5C are affected by the top surface 100. For example, when the direct reflectance of the top surface 100 decreases from 100% around to 90%, the light extraction efficiency can decrease by 18.42%, 18.13% and 20.28%. In another embodiment, when the top surface 100 changes from a surface having a reflectance of about 100% to a Lambertian surface of about 90% reflectance, the light extraction efficiency of the light-emitting apparatus decrease by 11.56%, 12.14% and 11.93%. In another embodiment, when the color temperature of the light emitted from the light-emitting device changes from 6500K to 30000K, the light extraction efficiency of the light-emitting devices in FIGS. 5A~5C can decrease by 7.63%, 7.58% and 6.22%. The properties of light emitted from the structures in FIGS. 1, 3A-3B, 4A-4C or 5A-5C are affected by the size of wavelength conversion layer 4, the size of total structure, the reflective rate of the top surface 100, or the color temperature of the light emitted from the light-emitting device.

FIGS. 6A-6F show light-emitting devices in accordance with embodiments of the present disclosure. The particles 3 are added in the wavelength conversion layer 4 of the light-emitting devices 2000A, 2000B and 2000E, added in the transparent layer 6 of the light-emitting devices 2000C and 2000F, and added in the transparent cover 8 of the light-emitting device 2000D. The particles 3 are used to improve light scattering or reflection. The particles 3 are not transparent, and can absorb at least a portion of the light emitted from the light-emitting diode. With the addition of particle 3, the color spaces uniformities of the light-emitting devices 2000A~2000F can be improved, although the light extraction efficiencies of the light-emitting devices 2000A~2000F are lowered by about 35%, 5%, 31%, 54%, 4% and 43% respectively.

As shown in FIGS. 3A~3E, the light extraction efficiency is not greatly affected by the reflectance of the surface of the sidewalls, no matter the surface is a Lambertian surface or a surface having about 100% reflectivity. As shown in FIGS. 1A~1H, 4A~4C, 5A~5C and 6A~6F, the light extraction efficiency is more likely affected by the reflectance of the surface of the carrier 10 or the sizes of the light-emitting device. For example, the higher reflectance of the surface of the carrier 10 can improve light extraction efficiency by about 18%~20%. Or, a reflective layer can be formed between the carrier 10 and the light-emitting device to improve light extraction efficiency by about 11%~12%. Moreover, the light-emitting devices having similar color space uniformity can have improved light extraction efficiencies by increasing the size of the light-emitting devices. For example, when the size of the light-emitting device is increased to 25 times, or more, larger than the size of the light-emitting diode, the light extraction efficiency of the light-emitting device is increased from 127 lm/W to 138 lm/W, which is substantially equal to an 8% increase.

Besides, the ratio, HWR, or the particles 3 within the structures can affect the uniformity of light form the light-emitting device. For example, the color space uniformity Δu'v' over the angle is less than 0.04 when the HWR is between 1.1~1.3. The color space uniformity Δu'v' over the angle between −80°~+80° is less than 0.01 when the concentration of the particles 3 in the structure is about 5%.

Figure 7A:
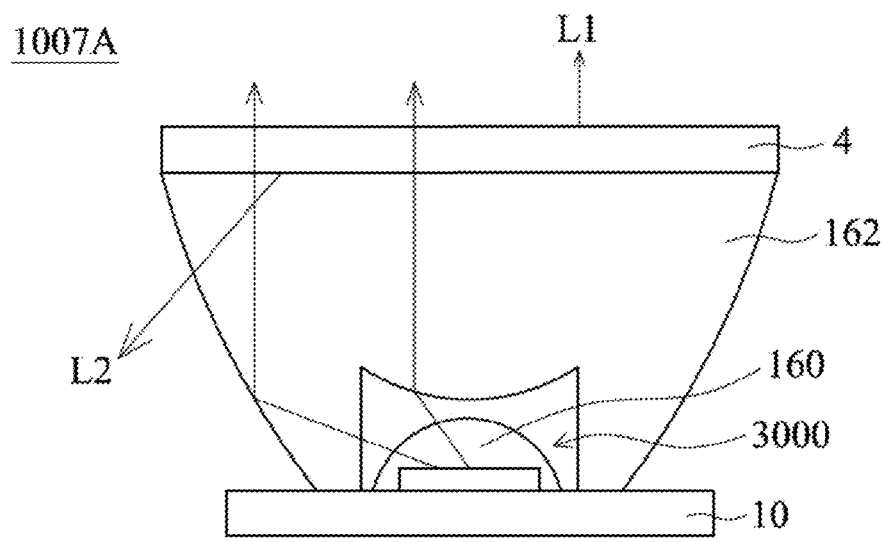
FIGS. 7A-7J show light-emitting apparatuses and light properties in accordance with embodiments of the present disclosure.
Figure 7B:
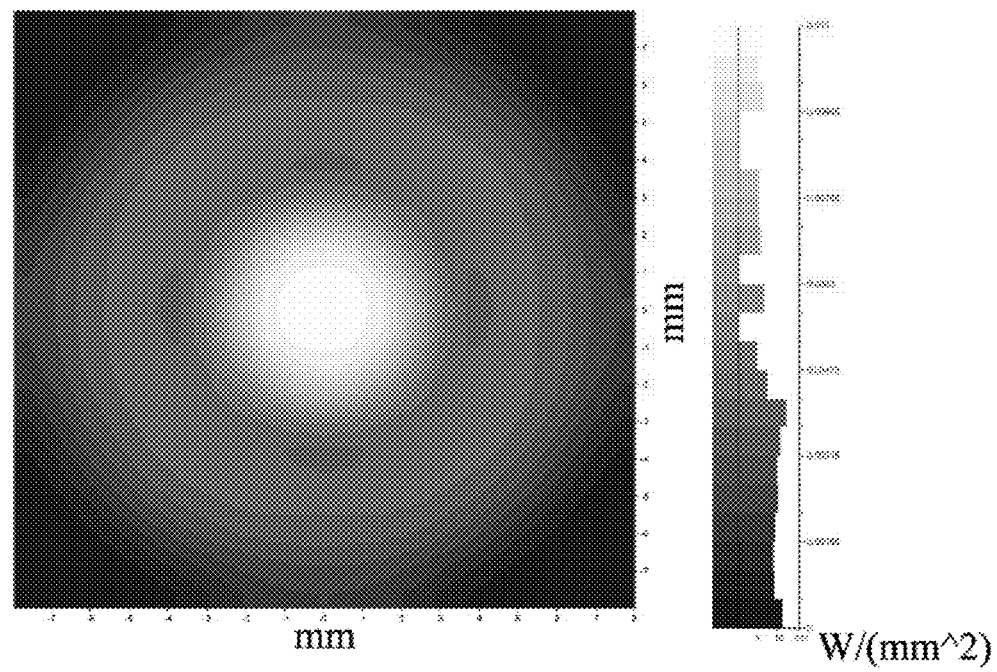
Figure 7C:
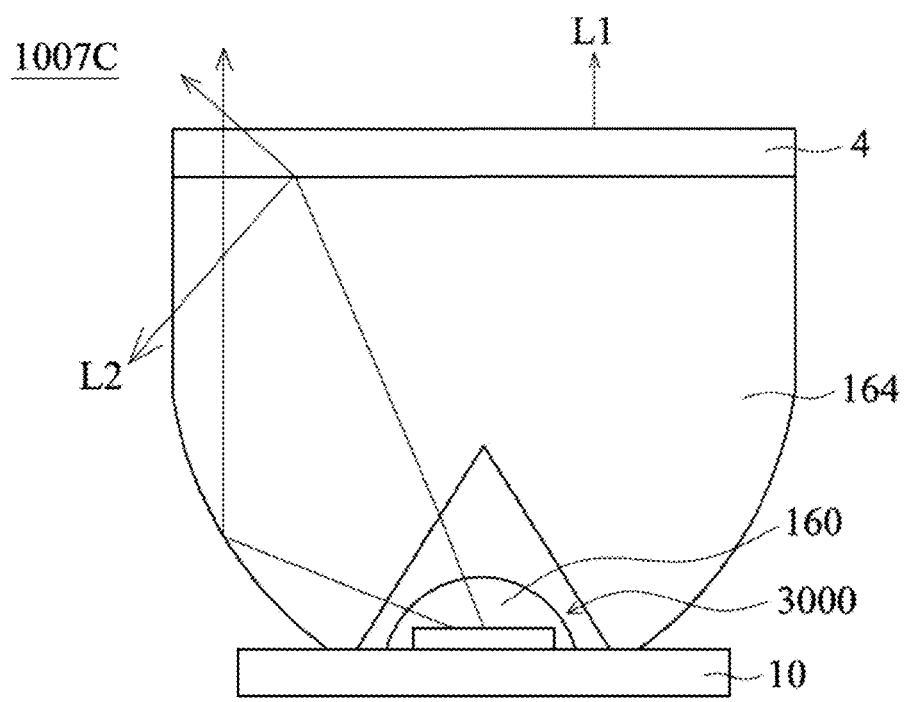
Figure 7D:
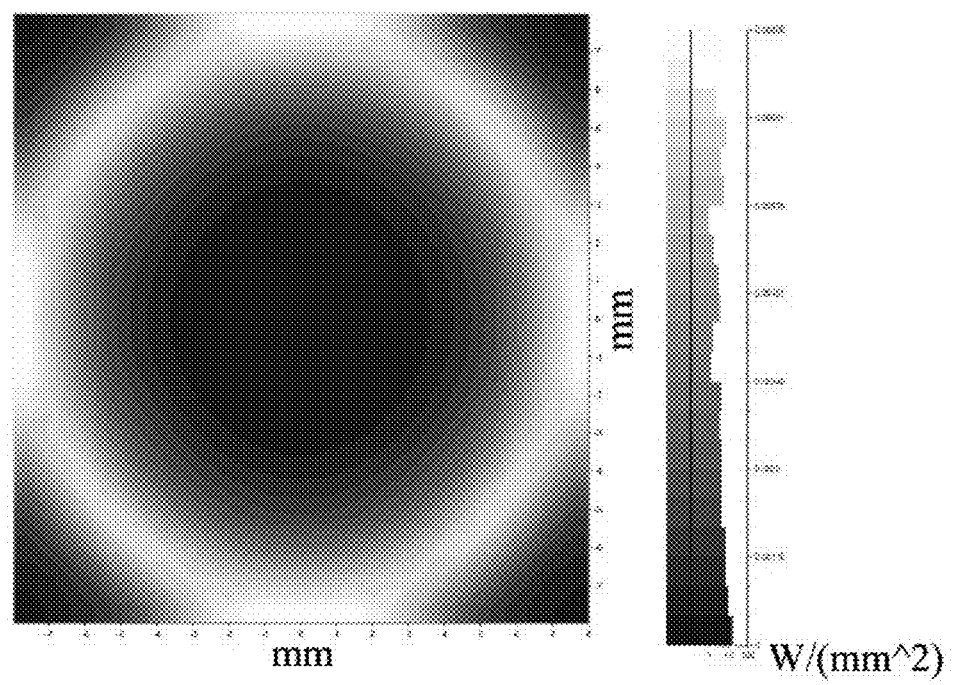
Figure 7E:
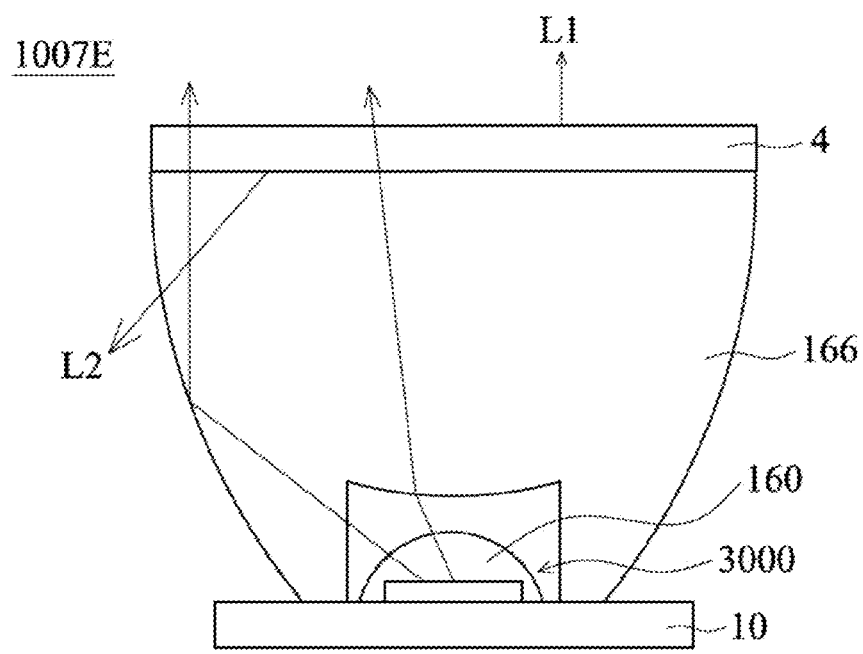
Figure 7F:
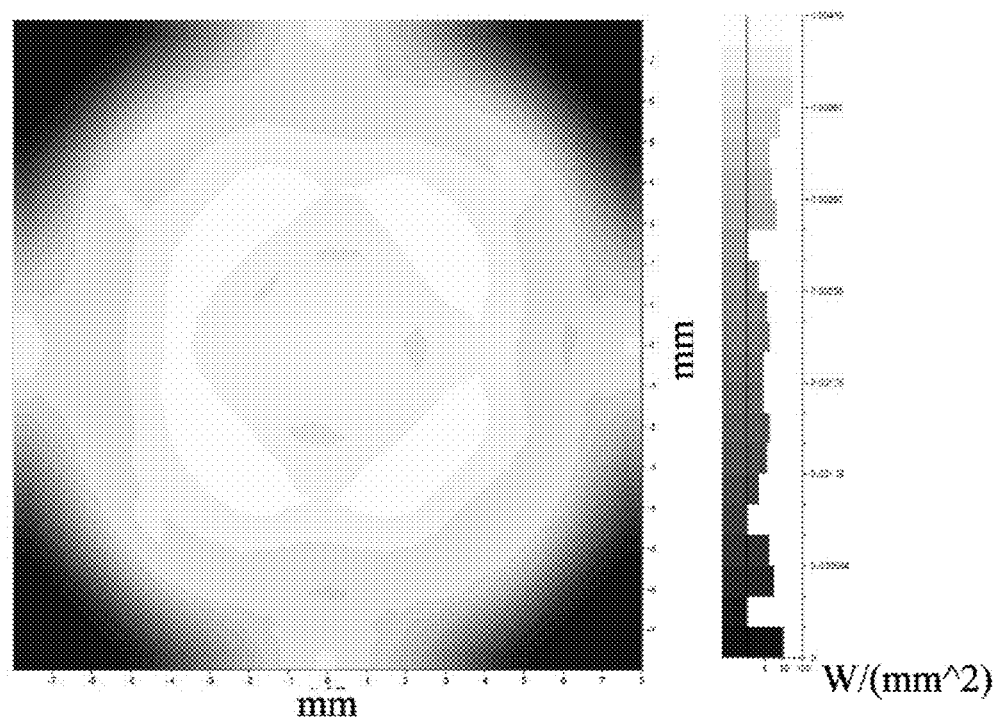

FIGS. 7A-7F show light-emitting apparatuses and some light properties in accordance with embodiments of the present disclosure. The bended lines with arrows in the FIGS. 7A, 7C and 7E represent the light paths within the light-emitting apparatuses. FIGS. 7B, 7D, 7F show the light pattern images of the light-emitting apparatuses.

The light-emitting apparatus in FIG. 7A has a light-emitting device 3000 formed on a carrier 10, a first lens 160 covering the light-emitting device 3000, a second lens 162 arranged on the first lens 160, and a wavelength conversion layer 4 arranged on the second lens 162. Light from the light-emitting device 3000 is firstly redirected by the first lens 160 and moves into the second lens 162. The light from the first lens 160 is then redirected by the second lens 162 and moves in a direction substantially perpendicular to the carrier 10. As shown in FIG. 7B, the light pattern has a brighter inner portion. The inner portion is substantially corresponding to the size and shape of the first lens 160. The area ratio of the inner portion to the entire light pattern is substantially corresponding to the area ratio of the frontal projected areas between the first lens 160 and the second lens 162.

In detail, as shown in FIG. 7A, the lens 162 has a top surface connected to the wavelength conversion layer 4, a bottom surface, side walls, and a cavity for accommodating the lens 160 and the light-emitting device 3000. The cavity has a convex surface which is bulged toward the light-emitting device 3000 and has a width substantially equal to or slightly greater than that of the lens 160. The side walls can inwardly approach with each other from the top surface to the bottom surface. In other words, the top surface is wider/bigger than the bottom surface in a cross section/top view. The side wall can be constructed by a flat surface, a curved surface, or both. In some embodiments, the top surface or the bottom surface can be made in a circle, oval, rectangle, triangle, or other geometric shape. Moreover, the top surface and the bottom surface can have identical or different shapes. Light from the light-emitting device 3000 can be reflected and/or refracted at the side wall or the convex surface when the incident angle is varied. The convex surface can converge or collimate more light to the central area of the top surface of the lens 162 than to the peripheral area thereof, as shown in FIG. 7B.

As shown in FIG. 7C, most of light from the light-emitting device 3000 is redirected to the edge or rim of the third lens 164 after refracting by the first lens 160 and refracting and reflecting by the third lens 164. Consequently, as shown in FIG. 7D, the edge or rim of light pattern is brighter than the inner portion.

In detail, as shown in FIG. 7C, the lens 164 has a top surface connected to the wavelength conversion layer 4, a bottom surface, side walls, and a cavity for accommodating the third lens 164 and the light-emitting device 3000. The cavity has a triangular cross section with slanted edges and a bottom width. The bottom width is greater than the greatest width of the lens 160. In some embodiments, the slanted edges or surfaces can diverge more light to the peripheral area of the top surface of the lens 166 than the central area thereof, as shown in FIG. 7D.

As shown in FIG. 7E, the fourth lens 166 has a structure similar to that of the second lens 162. In detail, as shown in FIG. 7E, the lens 166 has a flat top surface connected to the wavelength conversion layer 4, a bottom surface, side walls, and a cavity for accommodating the lens 160 and the light-emitting device 3000. The cavity has a convex surface with a curvature radius smaller than that of the lens 162. The light from the light-emitting device 3000 is firstly bent by the lens 160 and divergently moves into the lens 166. Compared with the structure shown in FIG. 7A, the light is diverged by the lens 166, especially by the convex surface, rather than collimated in a direction substantially perpendicular to the carrier 10, as shown in FIG. 7A. Besides, the light from the light-emitting device 3000 is also reflected by the sidewalls of the lens 166. The light pattern shown in FIG. 7F is more uniform than that shown in FIG. 7B in light intensity distribution.

Figure 7G:
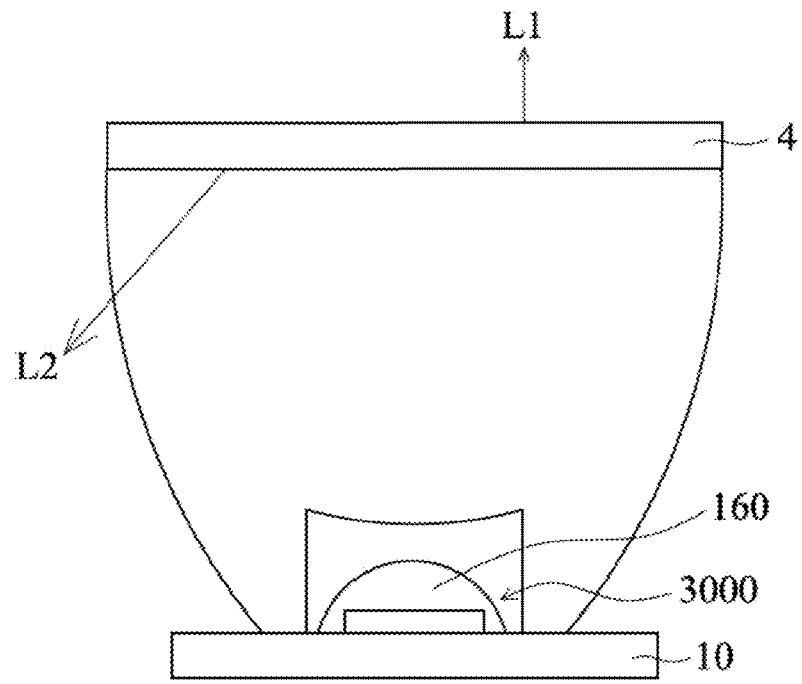
Figure 7H:
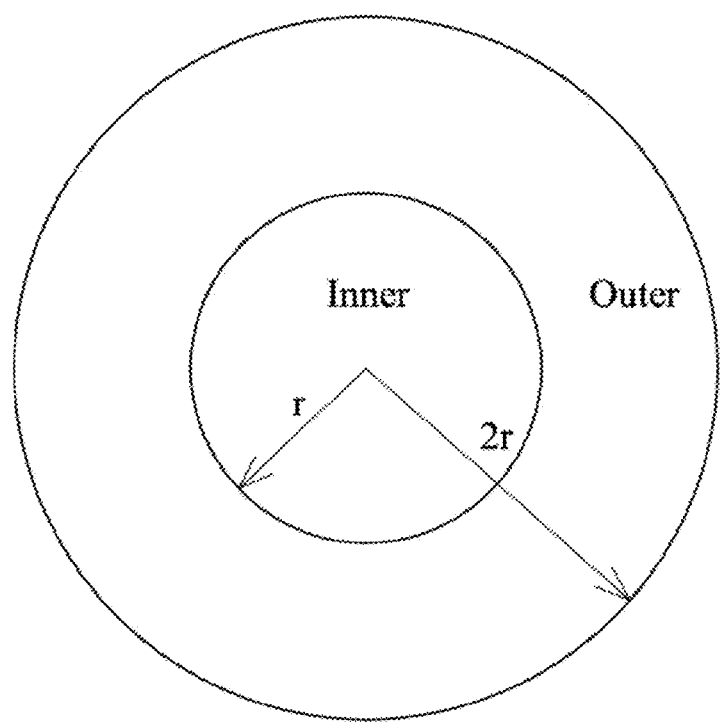

FIG. 7G shows the forward emission light (L1) and the backward emission light (L2) radiated from the wavelength conversion layer 4 in the light-emitting apparatus. The forward emission light (L1) and the backward emission light (L2) can have different optical properties for different light apparatuses. A table showing the optical property differences between the light apparatuses shown in FIGS. 7A, 7C, and 7E is listed below. For example, the difference of color temperature between the light (L1) and the light (L2) of the apparatus in FIG. 7A is less than 1000K, and the difference of the light extraction efficiency between the light (L1) and the light (L2) is larger than 10 lm/W.

| light emitting apparatus | FIG. 7A | FIG. 7C | FIG. 7E |
|---|---|---|---|
| Phosphor concentration_ | 30%_ | 30%/10%_ | 50%_ |
| thickness | 0.5 mm | 0.45 mm | 0.25 mm |
| CCT of L1 | 8455.27 | 6396.92 | 6568.98 |
| CCT of L2 | 9813.29 | 11430.87 | 8962.41 |
| Standard deviation of CCT between L1/L2 (K) | 2720.383 | 3487.41 | 1741.87 |
| Light extraction efficiency_L1 (lm/W) | 75.3189 | 47.40 | 75.62 |
| Light extraction efficiency _L2 (lm/W) | 62.9374 | 87.85 | 65.59 |
| Total Light extraction efficiency (lm/W) | 138.256 | 135.25 | 141.21 |

Figure 7I:
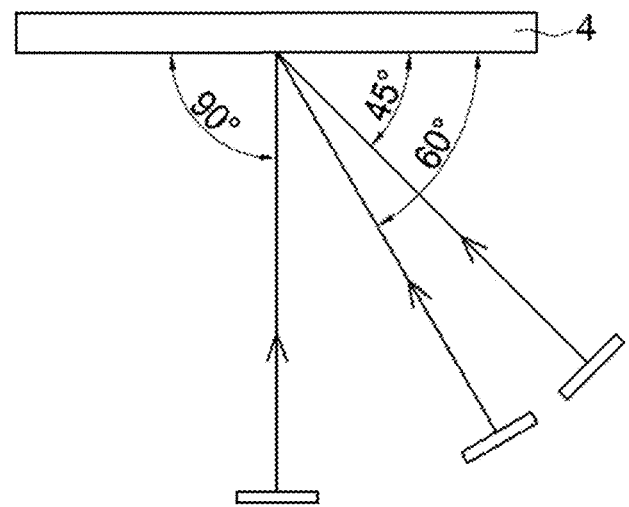
Figure 7J:
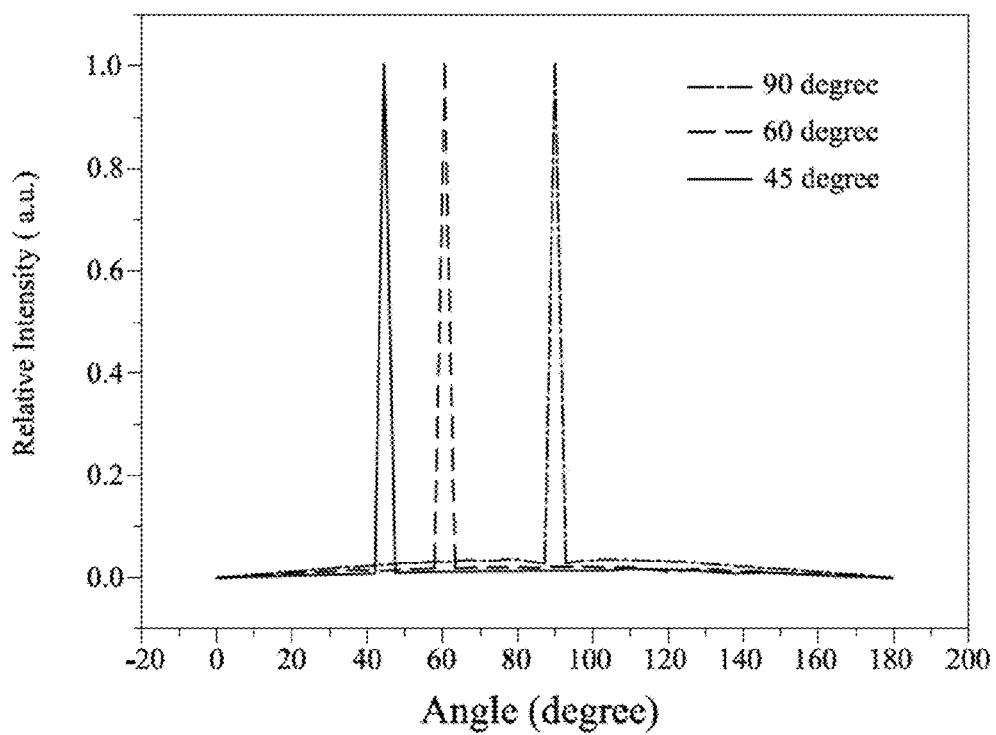

The wavelength conversion layer 4 in FIG. 7A has a 30% concentration of wavelength conversion material and a thickness of 0.5 mm, while that in the FIG. 7E has a 50% concentration of wavelength conversion material of 50% and a thickness of 0.25 mm. The wavelength conversion layer 4 in FIG. 7C has a 30% concentration of wavelength conversion material at outer portion, 10% concentration at inner portion (as shown in FIG. 7 H) and a thickness of 0.45 mm. In an embodiment, the angle between the light beam from the light-emitting device and the wavelength conversion layer is not likely to affect the optical property of the light provided by the light-emitting apparatus. Referring to FIGS. 7I~7J, the angles between the wavelength conversion layer and three light beams are 45°, 60° and 90° respectively, as shown in FIG. 7I. The corresponding intensities of the three light beams, which are measured at the side of the wavelength conversion layer opposite to the light beams, are almost the same, as shown in FIG. 7J.

Figure 8A:
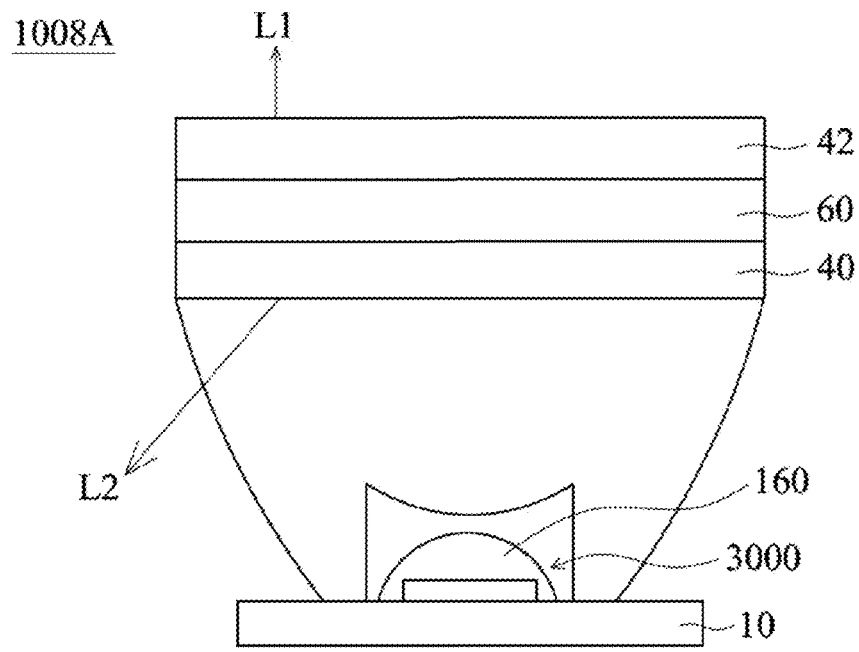
FIGS. 8A-8D show a light-emitting apparatus in accordance with embodiments of the present disclosure.
Figure 8B:
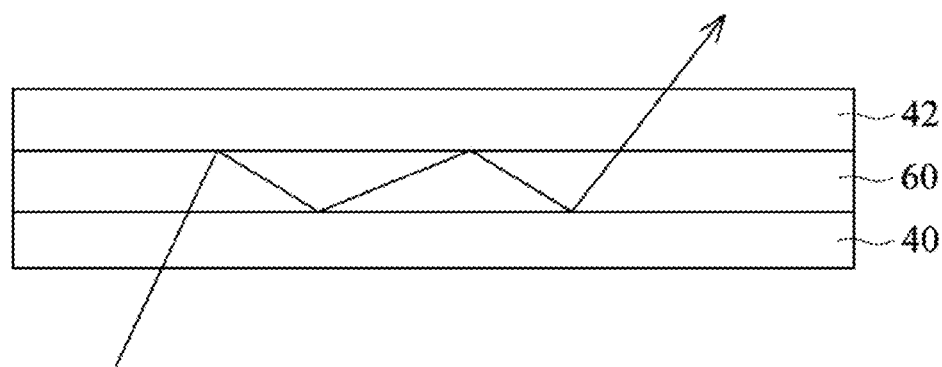

FIG. 8A shows a light-emitting apparatus 1008A with a stack including a first wavelength conversion layer 40, a second wavelength conversion layer 42, and a transparent layer 60 formed between the first and second wavelength conversion layers 40, 42. The optical properties of light emitted from the light-emitting apparatus 1008A are affected by some factors of the stack. For example, the thickness of the first or second wavelength conversion layer and the weight percentage concentration (wt %) of the first or second wavelength conversion layer are all factors possibly affecting the light extraction efficiency of the light-emitting apparatus 1008A. The light is more likely to be absorbed by the wavelength conversion layer with higher weight percentage concentration of the wavelength conversion material. The light extraction efficiency is therefore reduced when higher percentage of light is absorbed by the wavelength conversion layer. The light can pass through longer distance when the wavelength conversion layer has a larger thickness. The light is more likely to be absorbed, and the light extraction efficiency is therefore reduced. In another embodiment, referring to FIG. 8B, the stack is designed to reflect light back and forth between the first wavelength conversion layers 40 and the second wavelength conversion layer 42 before the light passing through the wavelength conversion layer 42. In an embodiment, referring to the table below, the first wavelength conversion layer 40 has a 70% concentration. The second wavelength conversion layer 42 has a 5% concentration. The thicknesses of the first wavelength conversion layer 40 and the second wavelength conversion layer 42 are both 0.3 mm. The standard deviation of CCT between the forward emission light (L1) and the backward emission light (L2) is 2720.383 for the apparatus 1007A in FIG. 7A and 1258.146 for the apparatus 1008A in FIG. 8A. The light-emitting apparatuses in FIGS. 7A and 8A have similar total light extraction efficiencies(≈138.256 lm/W and ≈137.087, respectively). The apparatus 1008A can retain the light extraction efficiency and provide a better standard deviation of CCT between the front side and back side by adopting a structure with two phosphor layers. In an embodiment, the concentration of the first wavelength conversion layer 40 has higher influence on the CCT of the forward emission light (L1); while the concentration of the second wavelength conversion layer 42 has higher influence on the CCT of the backward emission light (L2).

| light emitting apparatus | FIG. 7A | FIG. 8A |
|---|---|---|
| Phosphor concentration _ thickness | 30%_ 0.5 mm | 70%/5%_ 0.3 mm/0.3 mm |
| CCT of L1 | 8455.27 | 7248.63 |
| CCT of L2 | 9813.29 | 8114.13 |
| Standard deviation of CCT between L1/L2 (K) | 2720.383 | 1258.146 |
| Light extraction efficiency_L1 (lm/W) | 75.3189 | 66.6028 |
| Light extraction efficiency _L2 (lm/W) | 62.9374 | 70.4841 |
| Total light extraction efficiency (lm/W) | 138.256 | 137.087 |

Figure 8C:
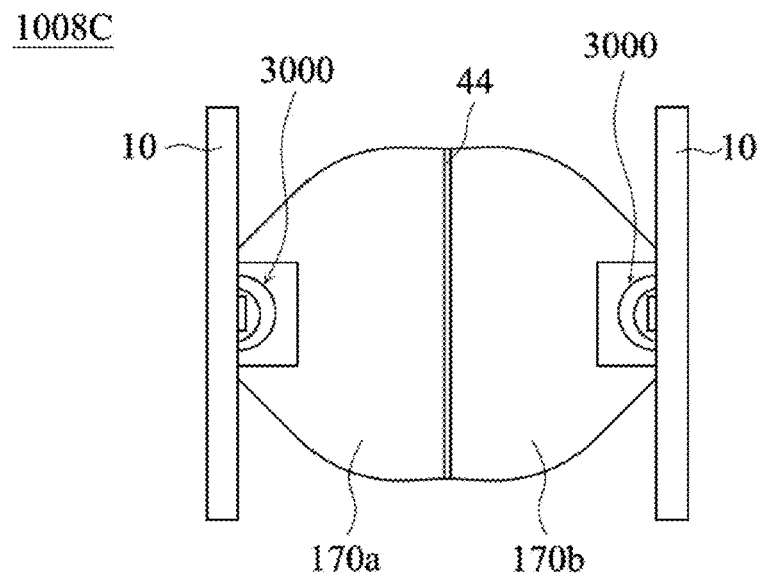
Figure 8D:
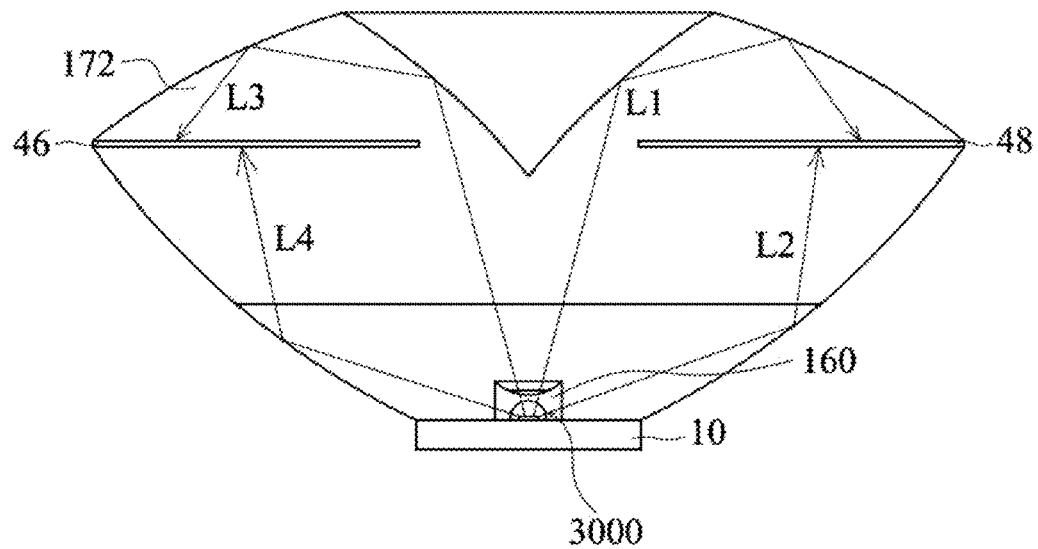

FIGS. 8C-8D show two light-emitting apparatus in accordance with embodiments of the present disclosure. The apparatus 1008C in FIG. 8C includes two light-emitting devices 3000 which is arranged on two carriers 10 to emit light in a left direction and a right direction, respectively. The left side and the right side of the wavelength conversion layer 44, formed between the lens 170*a* and 170*b*, can absorb and convert light respectively coming from the two light-emitting devices 3000. The two light-emitting devices 3000 can emit the same color light, such as infrared, red light, green light, blue light, and UV light. In an embodiment, the CCT of the light-emitting apparatus 1008C can be decreased down to about 6500K when the concentration of the wavelength conversion material in the wavelength conversion layer 44 is increased. However, the CCT is then kept unchanged at 6500K around when the concentration of the wavelength conversion material in the wavelength conversion layer 44 is even increased to 30% or more. The light extraction efficiency can be increased up to 290 (lm/W) around with the increase of the concentration of the wavelength conversion material in the wavelength conversion layer 44. However, the light-emitting efficiency is kept unchanged around 290 (lm/W) when the concentration of the wavelength conversion material in the wavelength conversion layer 44 is even increased to 30% or more.

The light-emitting apparatus 1008D in FIG. 8D includes a light-emitting device 3000 positioned on the carrier 10, two wavelength conversion layers 46 and 48, and a lens 172 covering the light-emitting device 3000 and the wavelength conversion layers 46 and 48. Referring to FIG. 8D, the lights L1 and L3 are redirected to incident the front side of the wavelength conversion layers 46 and 48. The lights L2 and L4 are redirected to incident the back side of the wavelength conversion layers 46 and 48. In an embodiment, the wavelength conversion layers 46 and 48 have the same thickness of 0.55 mm.

The light properties of the light-emitting apparatus are listed below. The lens 172 is symmetric with a central axis or a central plan (not shown), and therefore, can generate a symmetrical light paths. In other words, lights L1 and L3 are mirror images of each other; lights L2 and L4 are also mirror images of each other. The standard deviation of CCT between L1 and L2, or L3 and L4 is less than 600K, which is less than that of the light-emitting apparatus shown in FIG. 7A. The light-emitting efficiency is larger than 150 lm/W, which is larger than the light-emitting efficiency of the light-emitting apparatus shown in FIG. 7A.

| light emitting apparatus | FIG. 7A | FIG. 8D |
|---|---|---|
| Phosphor concentration _ thickness | 30%_ 0.5 mm | 30%_ 0.5 mm |
| CCT of L1 | 8455.27 | 6691.231 |
| CCT of L2 | 9813.29 | 7251.631 |
| Standard deviation of CCT between L1/L2 (K) | 2720.383 | 548.4152 |
| Light extraction efficiency_L1 (lm/W) | 75.3189 | 62.67172 |
| Light extraction efficiency _L2 (lm/W) | 62.9374 | 96.07058 |
| Total light extraction efficiency (lm/W) | 138.256 | 158.7423 |

Figure 9A:
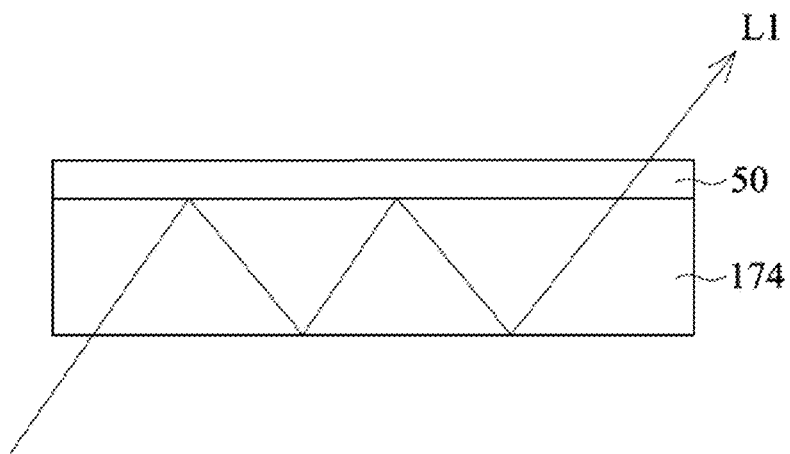
FIGS. 9A-9D show a light-emitting apparatus in accordance with embodiments of the present disclosure.

FIGS. 9A-9D show light-emitting apparatuses in accordance with embodiments of the present disclosure. Referring to FIG. 9A, the lens 174 is optically coupled with a wavelength conversion layer 50. The light can enter into the lens from one side and escape it at another side. The light can be reflected back and forth in the lens 174 if the incident angle of the light is properly controlled to create a total reflection at the top and bottom inner surfaces of the lens 174. The light can be absorbed by the wavelength conversion layer 50 with strikes at different positions. With absorption of more light, more converted light can be generated by the wavelength conversion layer 50.

Figure 9B:
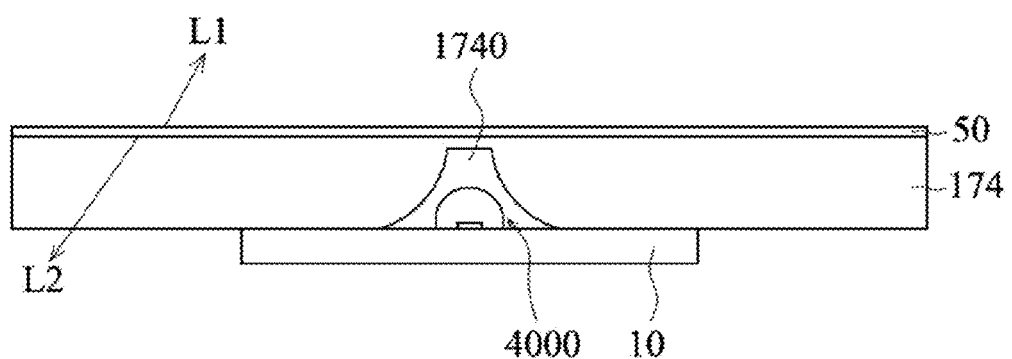
Figure 9C:
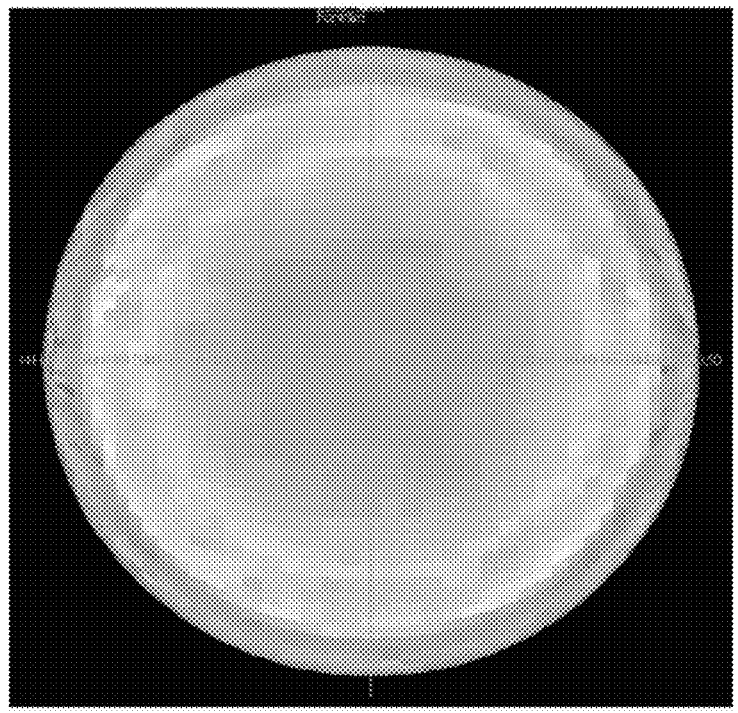
Figure 9D:
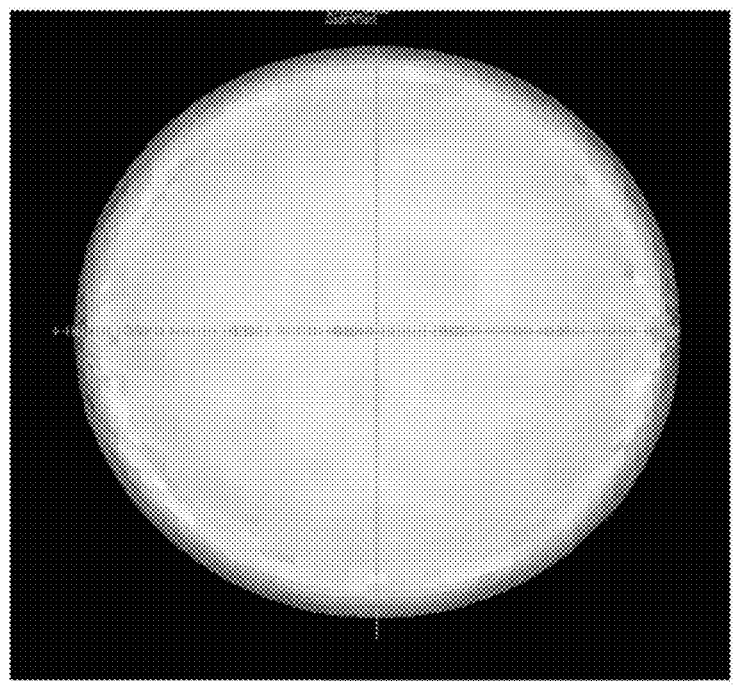

As shown in FIG. 9B, the light-emitting apparatus 1009B has a light-emitting device 4000 formed on a carrier 10, a lens 174 having a cavity 1740, and a wavelength conversion layer 50 arranged on the lens 174. The light-emitting device 4000 is arranged in the cavity 1740 and fully covered by the lens 174. FIG. 9C shows a light pattern viewed on a front side of the lens 174. FIG. 9D shows a light pattern viewed on a bottom side of the lens 174. The optical properties of the apparatus 1009B are listed below, wherein the standard deviation of CCT between light L1 and L2 is lower than 200K, the total light extraction efficiency is around 140 lm/W.

| light emitting apparatus | FIG. 7A | FIG. 9B |
|---|---|---|
| Phosphor concentration _ thickness | 30%_ 0.5 mm | 24%_ 0.45 mm |
| CCT of L1 | 8455.27 | 6593.7 |
| CCT of L2 | 9813.29 | 6292.65 |
| Standard deviation of CCT between L1/L2 (K) | 2720.383 | 160.89 |
| Light extraction efficiency _L1 (lm/W) | 75.3189 | 61.76 |
| Light extraction efficiency _L2 (lm/W) | 62.9374 | 73.42 |
| Total light extraction efficiency (lm/W) | 138.256 | 135.18 |

Figure 10A:
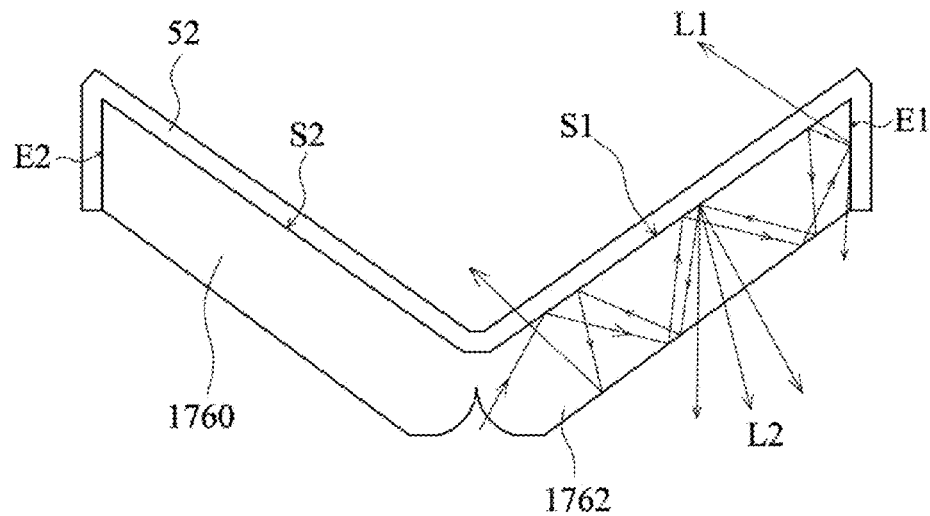
FIGS. 10A-10D show a light-emitting apparatus in accordance with embodiments of the present disclosure.
Figure 10B:
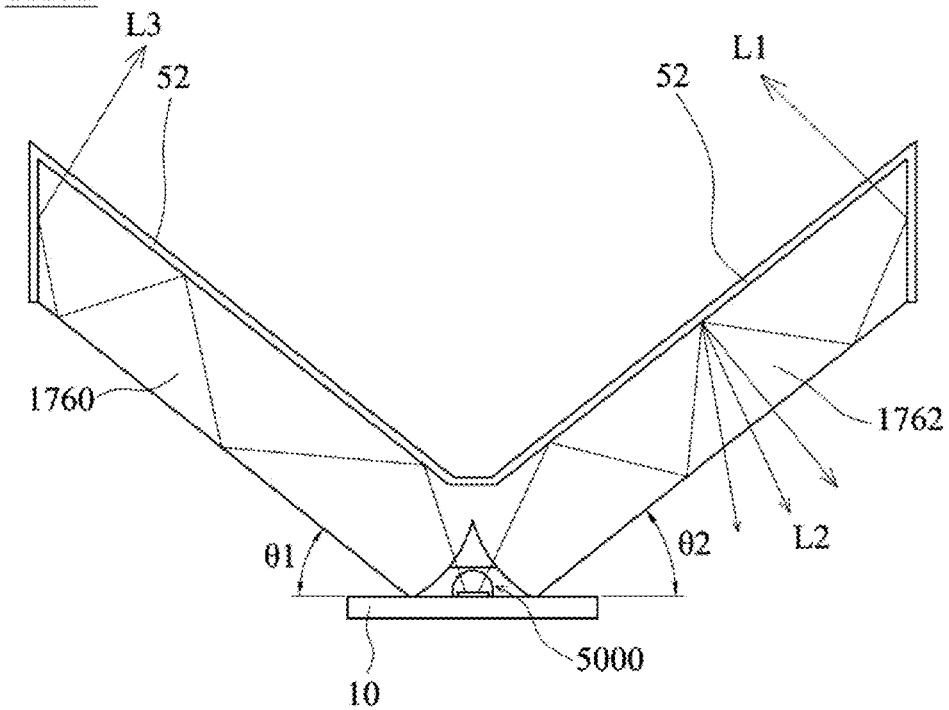
Figure 10C:
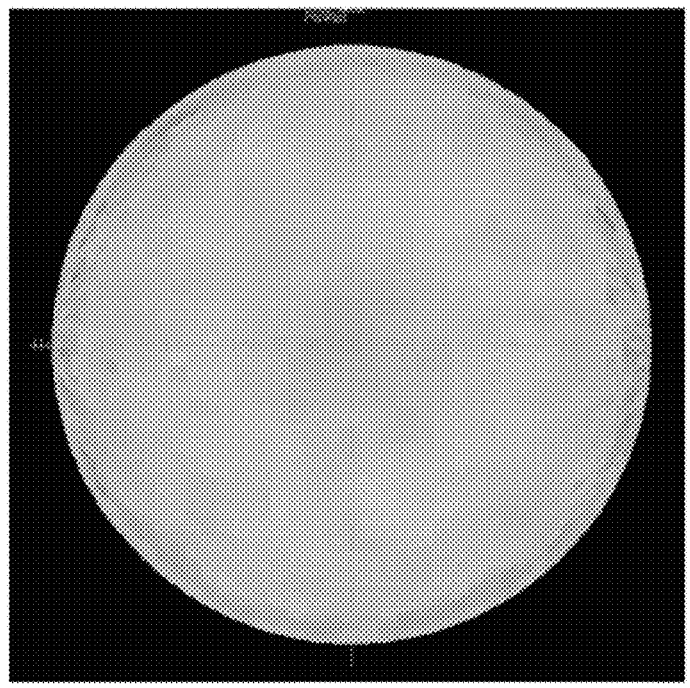
Figure 10D:
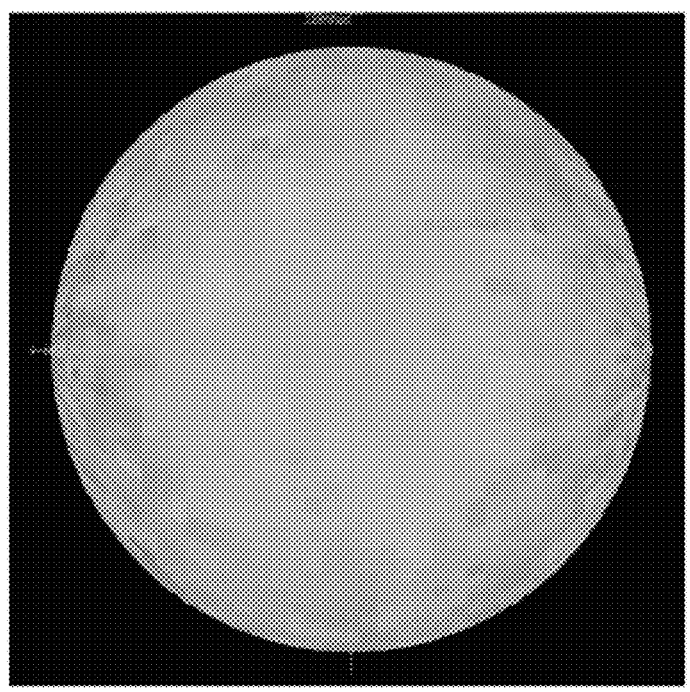

FIGS. 10A-10D show a light-emitting apparatus in accordance with embodiments of the present disclosure. Referring to FIG. 10A-10B, the light is reflected back and forth in the lens 176. The lens 176 has a first wing 1760 and a second wing 1762 which are inclined against the carrier 10 by angles θ1 and θ2, respectively. In one embodiment, the angle θ1 is 30°, which is equal to that of θ2. As shown in FIG. 10A, the light L1 is reflected two or more times within the second wing 1762 before passing through the wavelength conversion layer 52. The light L2 is reflected two or more times within the second wing 1762 and can leave the second wing 1762 towards a direction far away from the wavelength conversion layer 52 without passing through the wavelength conversion layer 52. The wavelength conversion layer 52 is not only formed on the surfaces S1 and S2 between the first wing 1760 and second wing 1762 but also on the edges E1 and E2 of the first wing 1760 and second wing 1762. As shown in FIG. 10B, the first wing 1760 and second wing 1762 are bifurcated above the light-emitting device 5000 in a V/U-like shape. The lights L1 and L3 are moving in similar paths as shown in the drawing. With adopting lens shown in FIGS. 10A-10B, the lights L1~L3 are more likely converted by the wavelength conversion layer 52. The light-emitting apparatus in FIG. 10B has a light-emitting device 5000 formed on a carrier 10, a lens 176 having a first wing 1760 and second wing 1762, and a wavelength conversion layer 52. FIG. 10C shows a front image of the lens 176. FIG. 10D shows bottom image of the lens 176. The optical properties of the apparatus are listed below, wherein the standard deviation of CCT is lower than 700K and the total light extraction efficiency is larger than 150 lm/W.

| light emitting apparatus | FIG. 7A | FIG. 10B |
|---|---|---|
| Phosphor concentration _ thickness | 30%_ 0.5 mm | 4%_ 0.5 mm |
| CCT of L1 | 8455.27 | 6342.11 |
| CCT of L2 | 9813.29 | 7416.94 |
| Standard deviation of CCT between L1/L2 (K) | 2720.383 | 657.92 |
| Light extraction efficiency_L1 (lm/W) | 75.3189 | 77.5 |
| Light extraction efficiency _L2 (lm/W) | 62.9374 | 80.87 |
| Total light extraction efficiency (lm/W) | 138.256 | 158.37 |

Referring to FIG. 11A, the apparatus has several light-emitting devices 6000 (five devices 6000 are shown in the drawing, but the number can be less or more), a diffusion layer 18 distant from the light-emitting devices 6000, a prism layer 20 on the diffusion layer 18, and an liquid crystal display (LCD) module 22 on the prism layer 20.The light-emitting devices 6000, the diffusion layer 18, and prism layer 20 can be integrated into a backlight module of LCD display. The LCD module 22 has a lens. The diffusion layer 18 can redistribute light from the light-emitting devices 6000, and increase the light uniformity of the light-emitting devices 6000. The prism layer 20 has numerous lenses to concentrate light. The light uniformity of the LCD module 22 is therefore increased. In an embodiment, the distance between the lens in the LCD module 22 and the light-emitting device 6000 is larger than that between the adjacent light-emitting devices.

Figure 11E:
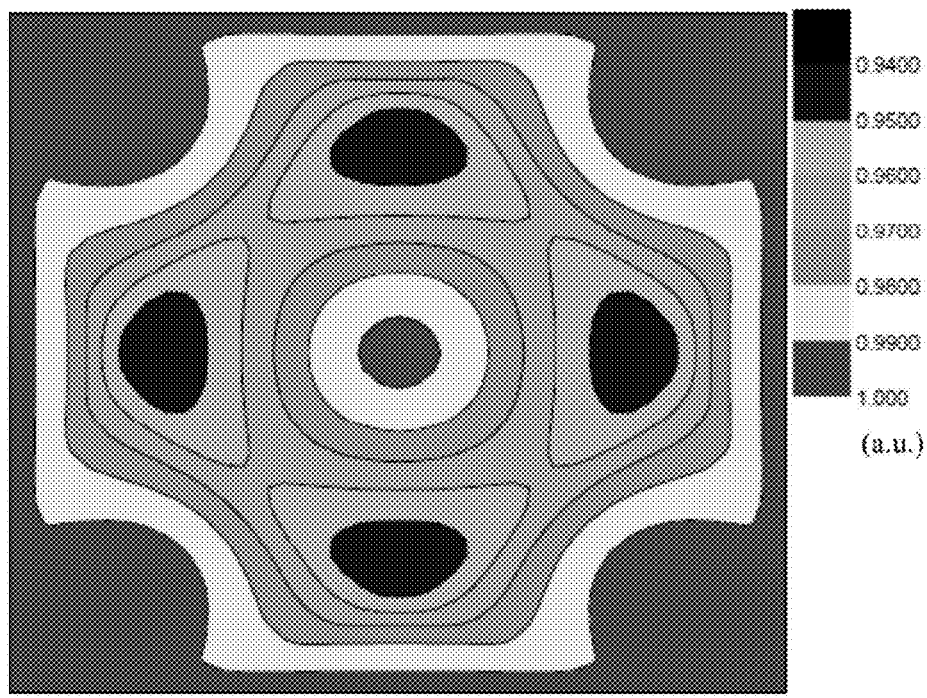
Figure 11F:
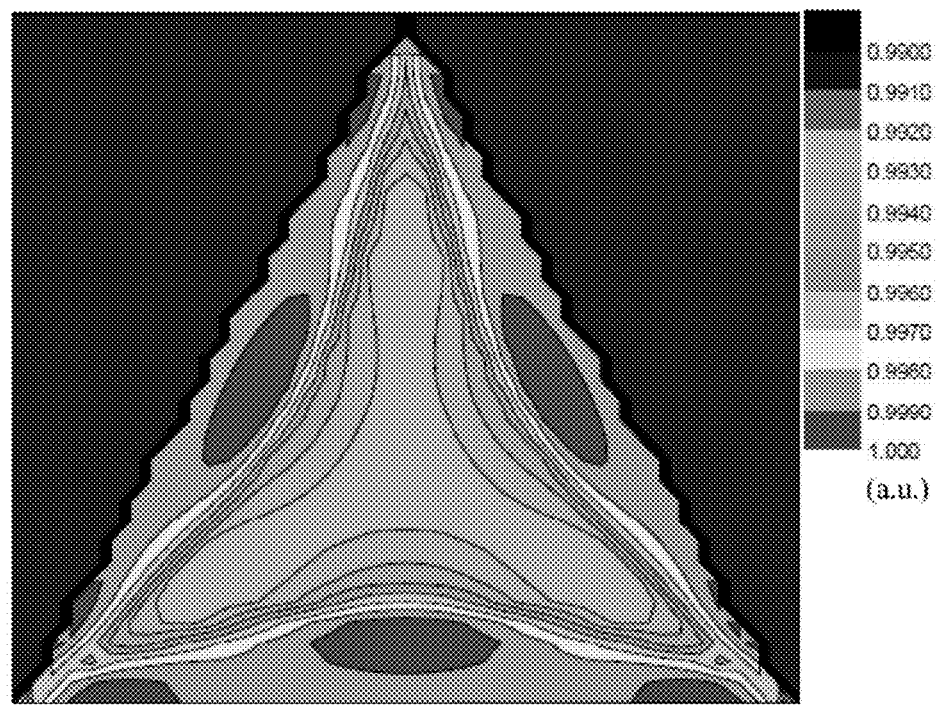

FIG. 11B shows a schematic view of the apparatus. The symbol H represents the distance between the light-emitting device 6000 and the LCD module 22, and the symbol R represents the radius of the light field showing on the LCD module 22. The symbol d represents the lateral distance between adjacent light-emitting devices. The shorter H implies a smaller light field with a shorter radius R at the LCD module 22. In an embodiment, the light-emitting device 6000 provides a light field on the LCD module 22 (or on the lens) having a radius R two or more times larger than the distance d. The FIGS. 11C-11D show a schematic top view of the arrangement of the light-emitting devices 6000. The light-emitting devices 6000 are arranged in a connected rectangular shape, as shown in FIG. 11C. The light-emitting devices 6000 are arranged in a connected triangular shape, as shown in FIG. 11D. Different arrangements of the light-emitting devices can provide different illumination distribution. FIG. 11E shows an illumination distribution image of a unit area of the array shown in FIG. 11C. FIG. 11F shows an illumination distribution image of a unit area of the array shown in FIG. 11D. In the embodiment, the radius R of the light field of a single light-emitting device 6000 can be set equal to the shortest distance between two adjacent light-emitting devices 6000. As shown in FIGS. 11E and 11F, different colors represent different illuminance level. The detail of the color mapping can be referred to the legend of respective diagram.

Figure 11G:
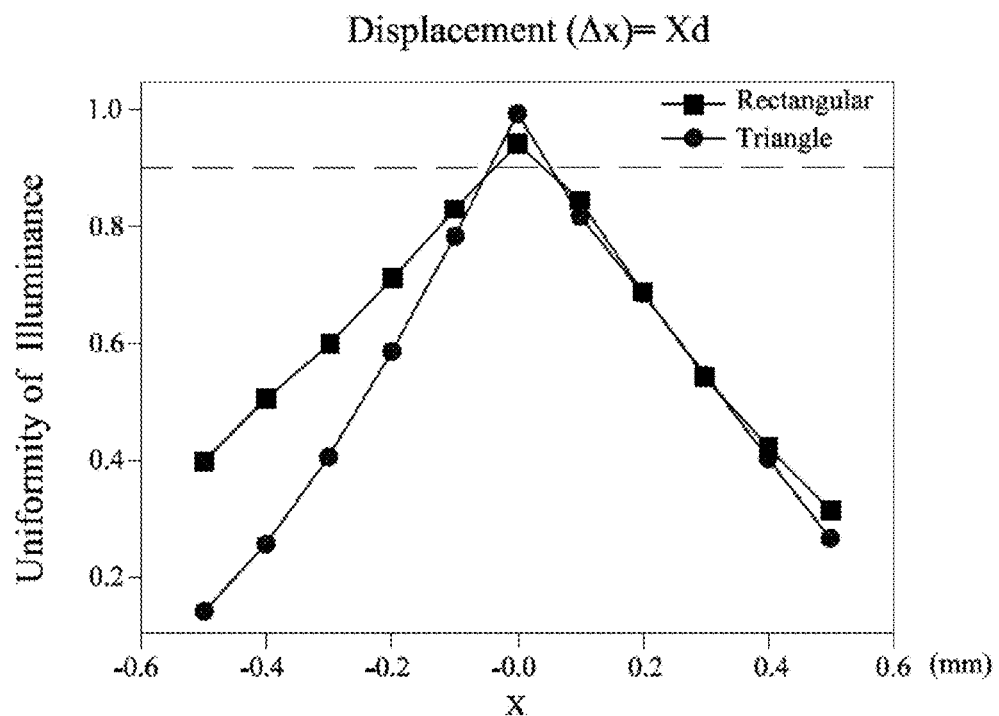
Figure 11H:
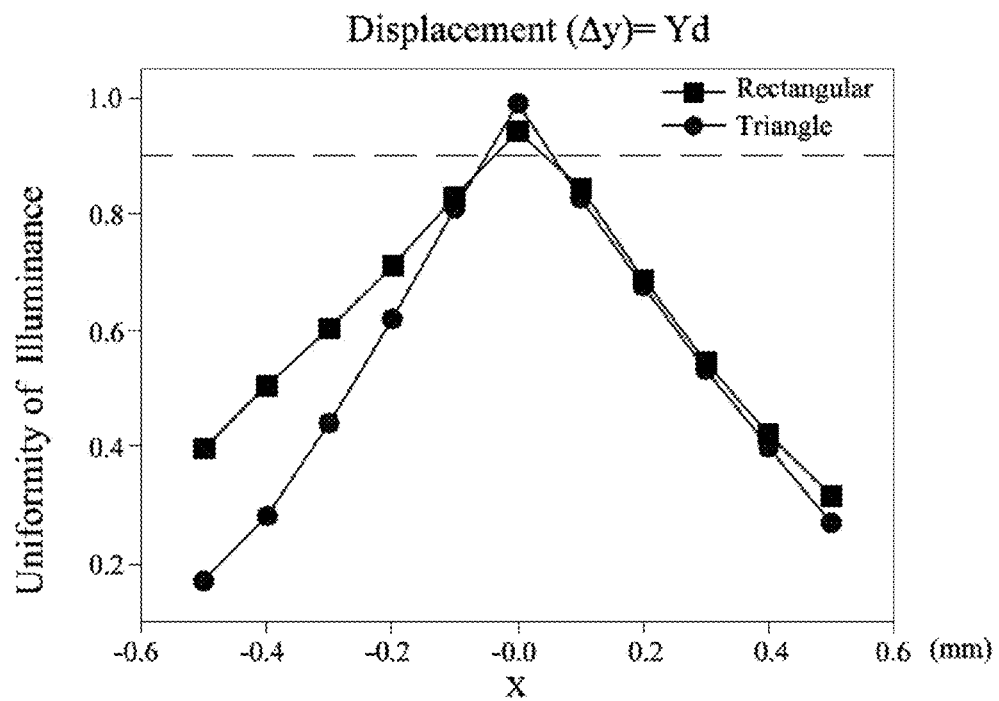

FIG. 11G is a diagram showing that the uniformity of illumination varies with a displacement of a light-emitting device 6000 in x direction. FIG. 11H is another diagram showing that the uniformity of the illumination varies with a displacement of a light-emitting device 6000 in y direction. The abscissa of the FIG. 11G or FIG. 11H represents the displacement of one light-emitting device 6000 with respect to an original position in the light-emitting apparatus. The ordinate of the FIG. 11G or FIG. 11H represents the normalized uniformity of illuminance of a light-emitting apparatus. As shown in FIGS. 11G and 11H, the positive (x>0 or y>0) and negative (x<0 or y<0) displacements result in similar decreasing levels of illumination uniformities in the rectangular arrangement. However, the positive (x>0 or y>0) and negative (x<0 or y<0) displacements result in different decreasing levels of illumination uniformities in the triangle arrangement. Specifically, in the triangle arrangement, the negative displacement results in a more rapid drop in the illumination uniformity than the positive displacement does. In either rectangular or triangle arrangement, the illuminance uniformity is substantially lower than 0.9 when the absolute value of the displacement is about 0.1 mm.

Figure 12A:
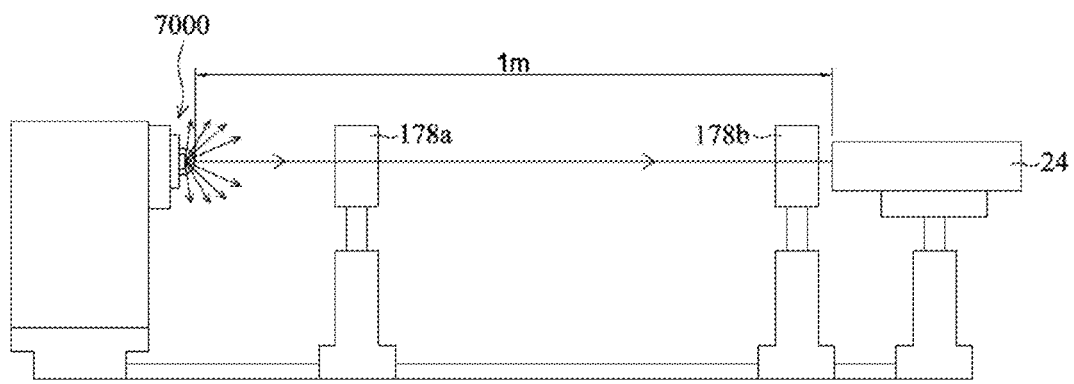
FIGS. 12A-12E show measuring instruments related to a light-emitting device and related results in accordance with an embodiment of the present disclosure.
Figure 12B:
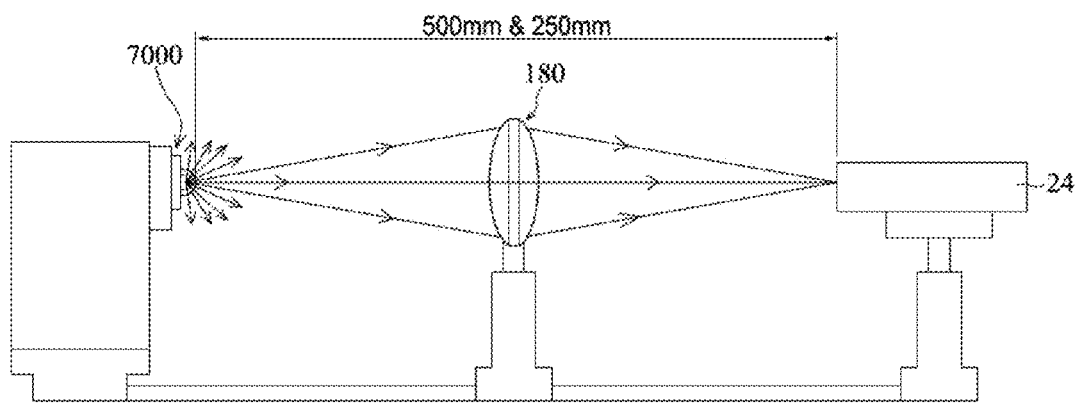

FIGS. 12A-12B show measuring instruments in accordance with embodiments of the present disclosure. The instrument in FIG. 12A can measure the light properties of a light-emitting device 7000 in far-field. The light from the light-emitting device 7000 can pass through a first iris 178a and a second iris 178b and be received by a spectrometer 24. The first iris 178a and the second iris 178b can remove part of the light and retain light in a specific angle to be detected by the spectrometer 24. The instrument in FIG. 12B can measure the light properties of a light-emitting device 7000 in mid-field. The light from the light-emitting device 7000 can pass through a convex lens 180 and be received by the spectrometer 24.

Figure 12C:
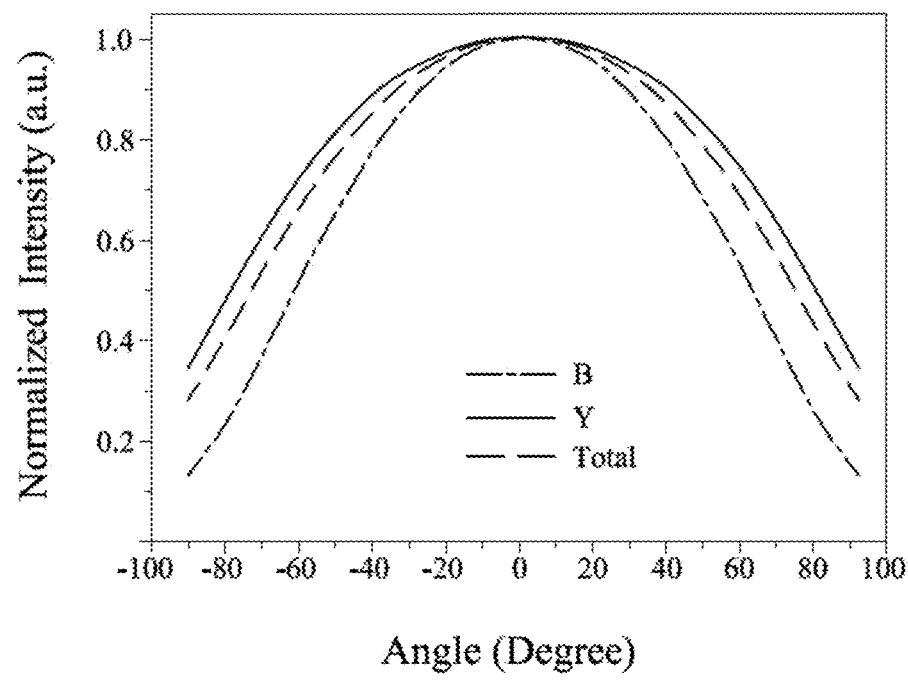
Figure 12D:
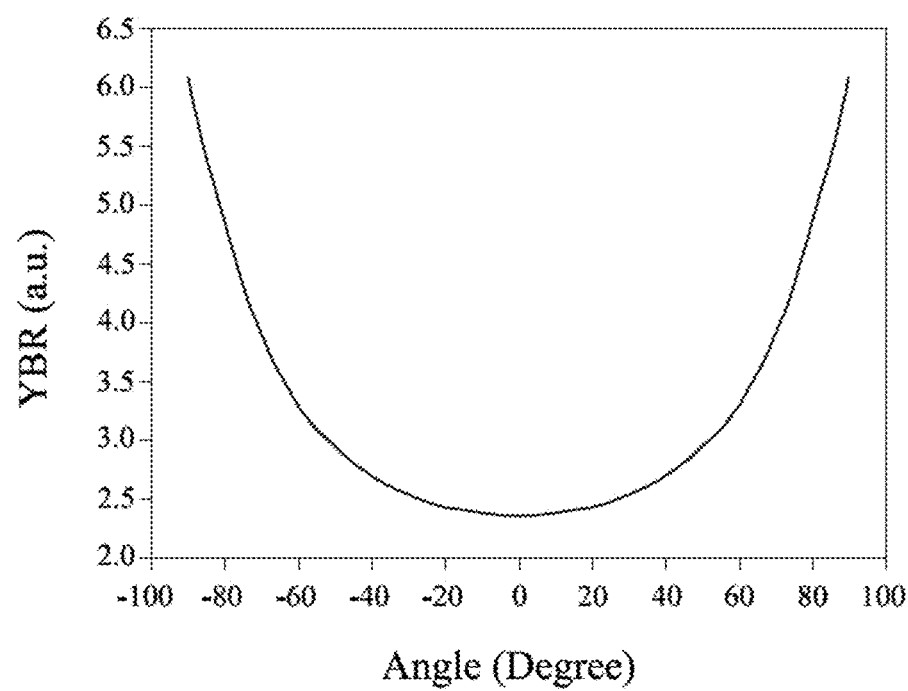
Figure 12E:
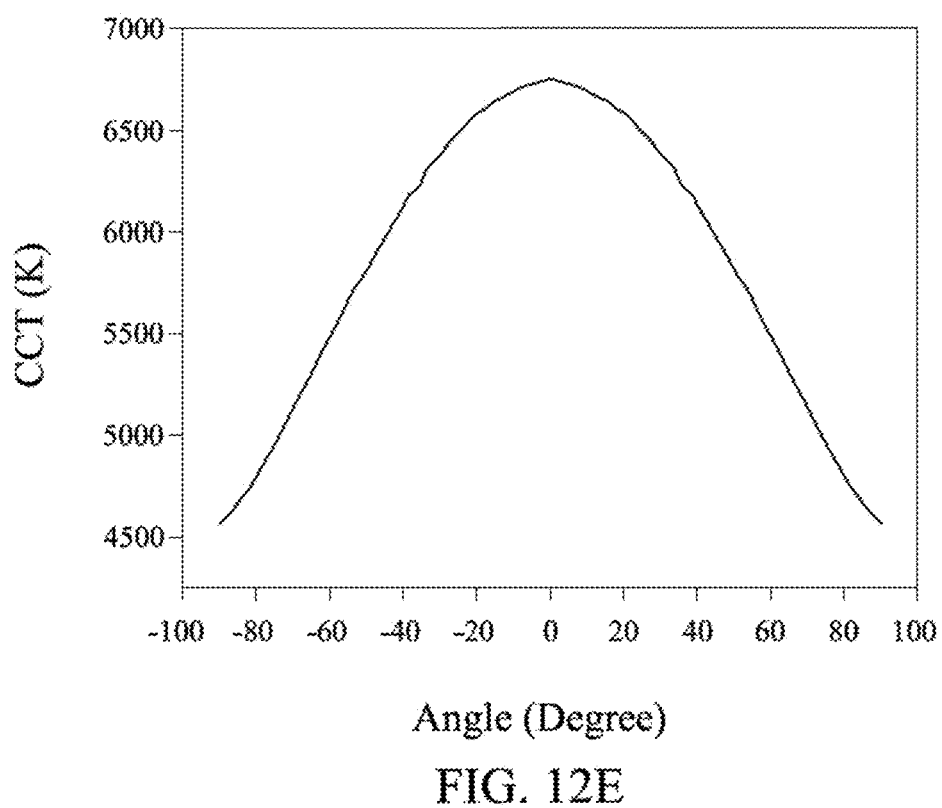

FIGS. 12C-12E show some results measured by the instrument shown in FIG. 12A. 0 degree in FIGS. 12C-12E substantially corresponds to the center of the light-emitting device 7000. The angle represents the angle between the measuring point and the center of the light-emitting device 7000. FIG. 12C shows the normalized intensities of blue light, yellow light, and total light. The total light can include the blue light, the yellow light, or other color light. As shown in the drawing, different lights have different intensities at the same angle. FIG. 12D shows the light intensity ratio of the yellow light to the blue light (YBR). The ratio increases with the increase of absolute value of the angle. Specifically, yellow light can be more easily observed at larger angle, which results in a light pattern having a yellowish peripheral region. Referring to FIG. 12E, the correlated color temperature (CCT) decreases from over 6500K at 0 degree (around the center of the light-emitting device) to about 4500K at 90 degree (around the peripheral region of the light-emitting device).

Figure 13:
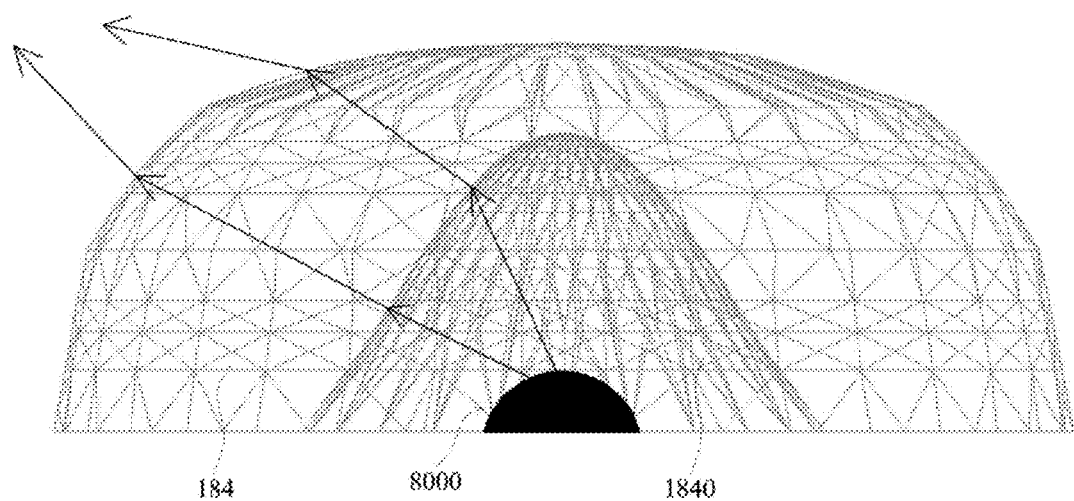
FIG. 13 shows a light-emitting apparatus in accordance with an embodiment of the present disclosure.

As shown in FIG. 13, a lens 184 can be arranged on the light-emitting device 8000 to render a more uniform illuminance and/or color distribution. The lens 184 can direct the blue light to a direction with a larger angle and the yellow light to a direction with a smaller angle. The lens 184 has a main body and a cavity 1840 which is built from a bottom surface of the main body and defines a space for accommodating the light-emitting device 8000. The cavity 1840 has a top inner surface with a bell/dome-like shape/contour and a bottom inner surface with a tail extending to the bottom surface of the lens 1840 in a cross-sectional view. The top inner surface and the bottom inner surface can have identical or different curvatures. Moreover, the top inner surface itself or the bottom inner surface itself can have one or more curvatures. The lens 184 has an outer contour with several sections connected with each other (the section can be seen as a line in a cross sectional view, as shown in FIG. 13). The transition portion of two adjacent sections preferably has a perceived angular change to redirect specific color light to a predetermined direction. For example, the color light with shorter wavelength, such as a blue light, can be bended downward after striking a higher section of the lens 184; the color light with longer wavelength, such as a yellow light, can be bended upward after striking the a lower section portion of the lens 184.

1. It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting apparatus, comprising:
a light-emitting diode, comprising a first top surface and a first side surface; and
an outmost transparent cover covering the first top surface and having a second top surface and a second side surface,
wherein a ratio of a distance between the first top surface and the second top surface to a distance between the first side surface and the second side surface is between 1.1-1.3.

2. The light-emitting apparatus according to claim 1, further comprising a transparent layer formed between the light-emitting diode and the transparent cover.

3. The light-emitting apparatus according to claim 1, further comprising a carrier having a third top surface connected to a bottom side, which is opposite to the first top surface.

4. The light-emitting apparatus according to claim 3, wherein the third top surface is a Lambertian scattering surface.

5. The light-emitting apparatus according to claim 1, further comprising a lens arranged on the light-emitting diode, wherein the lens comprises a first wing and a second wing.

6. A light-emitting apparatus, comprising:
a light-emitting device;
a wavelength conversion layer covering the light-emitting device and having wavelength particles;
a first lens, having a top surface bent in a first direction, on the light-emitting device; and
a second lens, connected to the wavelength conversion layer, and having an inner surface bent in a second direction on the first lens,
wherein the first direction is different from the second direction, and
wherein the light-emitting apparatus has a first light extraction efficiency in the first direction and a second light extraction efficiency in the second direction, a difference between the first light extraction efficiency and the second light extraction efficiency is larger than 10 lm/W.

7. The light-emitting apparatus according to claim 6, wherein the light-emitting apparatus is configured to provide a first optical property in the first direction and a second optical property different from the first optical property in the second direction.

8. The light-emitting apparatus according to claim 7, wherein a difference between the first optical property and the second optical property is a color temperature difference less than 1000K.

9. The light-emitting apparatus according to claim 6, wherein the wavelength conversion layer comprises a first wavelength conversion layer, a second wavelength conversion layer and a transparent layer, the transparent layer has a solid material and is sandwiched by the first wavelength conversion layer and the second wavelength conversion layer.

* * * * *